United States Patent [19]
Miller et al.

[11] Patent Number: 5,933,102
[45] Date of Patent: Aug. 3, 1999

[54] CAPACITIVE SENSITIVE SWITCH METHOD AND SYSTEM

[75] Inventors: Stephen J. Miller, Jonestown; Michael S. West, Austin, both of Tex.

[73] Assignee: Tanisys Technology, Inc., Austin, Tex.

[21] Appl. No.: 08/935,468

[22] Filed: Sep. 24, 1997

[51] Int. Cl.[6] .................................................. H03K 17/96
[52] U.S. Cl. ............................... 341/33; 341/34; 341/26; 324/678
[58] Field of Search .................................. 341/34, 26, 33; 324/678; 200/600; 345/174, 173; 178/18.02

[56] References Cited

U.S. PATENT DOCUMENTS

| | | | |
|---|---|---|---|
| 4,698,460 | 10/1987 | Krein | 345/173 |
| 4,698,461 | 10/1987 | Meadows | 345/174 |
| 4,707,845 | 11/1987 | Krein | 345/174 |
| 4,733,222 | 3/1988 | Evans | 341/33 |
| 4,772,874 | 9/1988 | Hasegawa | 341/26 |
| 4,860,232 | 8/1989 | Lee | 702/104 |
| 5,012,124 | 4/1991 | Hollaway | 307/116 |
| 5,053,757 | 10/1991 | Meadows | 345/173 |
| 5,072,427 | 12/1991 | Knowles | 367/118 |
| 5,130,661 | 7/1992 | Beck | 324/663 |
| 5,270,710 | 12/1993 | Gaultier | 341/33 |
| 5,386,219 | 1/1995 | Greanias | 345/174 |
| 5,459,529 | 10/1995 | Searby | 348/586 |
| 5,463,388 | 10/1995 | Boie | 341/33 |
| 5,469,364 | 11/1995 | Hughey | 324/676 |
| 5,508,700 | 4/1996 | Taylor | 341/33 |
| 5,565,658 | 10/1996 | Gerpheide | 178/18.02 |
| 5,586,042 | 12/1996 | Pisau | 702/65 |
| 5,594,222 | 1/1997 | Caldwell | 200/600 |

*Primary Examiner*—Michael Horabik
*Assistant Examiner*—Albert K. Wong
*Attorney, Agent, or Firm*—Baker & Botts, L.L.P.

[57] ABSTRACT

A touch sensor switch that responds to touching, or even to the proximity of an object, is disclosed. The switch includes a number of capacitance elements, or touch pads, that produce an effective capacitance dependent upon the physical proximity of the object. A microcontroller under control of a program stored in a read-only memory causes its I/O port to set a transient voltage on each capacitance element as a logic level. Each transient voltage is at variance with the capacitive element's preferred voltage level. The program then reads the I/O port, and hence the logic levels of the capacitance elements, as the capacitive elements revert to their preferred voltage levels, and calculates the proximity of the object, or touching, from relationships among recorded signals. The circuit may also be embodied in an application specific integrated circuit.

25 Claims, 7 Drawing Sheets

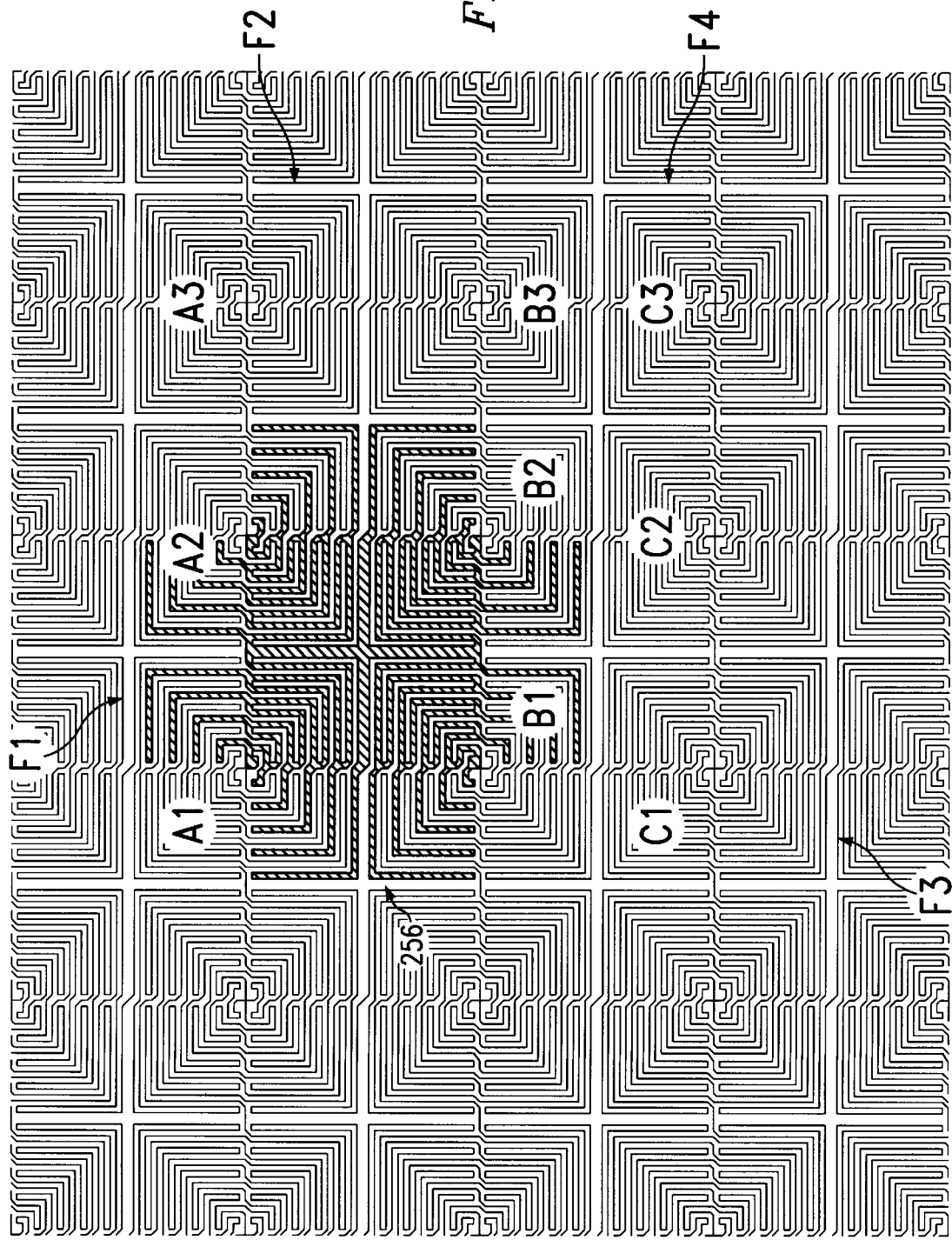

CAPACITIVE SENSITIVE SWITCH METHOD AND SYSTEM

FIELD OF THE INVENTION

This invention relates generally to touch sensor switches, and more particularly to an automated digital system for sensing the capacitance of touch pads to determine when a physical object has come into contact with a touch pad.

BACKGROUND OF THE INVENTION

Capacitive sensitive touch switches are known which use a microcontroller having only a single 8-bit I/O port wherein each capacitive sensitive touch switch is directly attached to both a pin of the I/O port and to a resistor connected to the circuit's ground. The microcontroller program simultaneously measures the capacitance of all the touch switches by:

1. simultaneously writing a logic one to all eight I/O port pins, effectively charging the touch switches;
2. simultaneously reading the port's eight binary logical values 64 consecutive times into the microcontroller's RAM, as the touch switches discharge through their attached resistors;
3. applying a binary search algorithm to the RAM to determine at which measurement iteration each I/O port pin transitions from a logic one to a logic zero; and,
4. comparing the result with earlier measurements to determine if a physical object has come in contact with a touch pad.

These prior embodiments were limited to measuring a maximum of eight switches on a single I/O port because of two interrelated technical concerns:

1. widely varying capacitance of geographically distributed touch switches having widely differing trace lengths back to the microcontroller's I/O port; and,
2. the speed with which a single microcontroller can process touch measurements made in the described manner.

Additionally, in another limitation, the described implementation requires that the 8-bit I/O port be physically dedicated to the touch measurements of the eight touch switches. The port cannot be used to make measurements on other switches, to provide communications, or to perform other common microcontroller I/O tasks.

These prior capacitive sensitive switches utilized multiple microcontrollers to avoid extra capacitance, or capacitance spread, which is engendered by long, or widely varying, trace lengths when more than eight capacitive sensitive touch pads are attached to a single microcontroller. If the capacitance measurements vary too widely, the recording of touch pad logic values for all touch pads a predetermined number of times fails since the number of readings required during the entire discharge cycle either exceeds available memory, or requires such an increase in the time delay between consecutive readings that the detection of a touch is rendered unreliable.

The extra capacitance from the trace lengths also reduces the percentage change in the switch's overall capacitance from a touch. These prior capacitive sensitive switches also utilized multiple microcontrollers to avoid the extra time required to both process and report events from multiple I/O ports attached to a single unit. Since the I/O ports must be measured sequentially, the resulting recorded data searched, and touch events reported at a rapid enough rate to provide user feedback to touch events, a single low-cost microcontroller can be overtaxed. What is desired is a faster way of measuring the data, of searching the data, or of doing both.

Thus, the described prior art required the cooperation of multiple microcontrollers when plural (more than eight) capacitive sensitive switches are used. The use of multiple microcontrollers requires increased communication, thus adding several undesirable costs:

the cost of the additional I/O pins on each microcontroller for communication;

the cost of developing and maintaining multiple firmware versions, possibly one for each such microcontroller; and the cost of additional firmware space to communicate among the microcontrollers.

Such prior touch switch systems also suffer from the coupling of charges between touch pads which produce erroneous indications of a touch having occurred.

In addition, such prior touch switch systems typically discharge less than all capacitive sensitive switches simultaneously. Consequently, switches that are geographically close with different discharge time schedules interact with one another unfavorably. That is, when the voltage level of one switch is kept at a constant level, nearby discharging switches provide an unnecessary and undesirable charge storage mechanism that contributes to noise and uncertainty. In a particular instance, the introduction of a foreign substance or liquid that flows slowly across multiple pads provides a mechanism for transmitting stored energy from the pad being held at a constant potential into the pad being measured, thereby adversely modifying its measurement and generating false touch events.

Other capacitive sensitive switches are known in the art as disclosed in U.S. Pat. No. 5,508,700 to Taylor, which is assigned to the assignee of the present application. According to the patent, there are a number of capacitive sensitive elements or touch pads, each of which produces an effective capacitance when touched by a physical object. A signal is supplied through switching circuits to charge a selected pad. A discharge circuit, including one or more resistors, bleeds the charge on the pad. The resulting signal from the pad, as it is discharged, is compared to a threshold value in a threshold signal circuit. The result of the comparison is used to indicate whether the pad has been touched. Taylor also discusses the reverse process of comparing a charging signal to a threshold value in a threshold signal circuit to determine when a touch has occurred.

The Taylor patent uses multiple diodes, at least one per touch pad, to select the pads for charging and discharging. Further, a microcontroller is disclosed which is used primarily as a switch control circuit to select the connections to the pads. The microcontroller may also contain a timer that responds to the signal generated by the threshold signal circuit.

Further, the microcontroller of Taylor must either utilize a large number of I/O pins or complex external switching logic. The first embodiment disclosed in Taylor uses four I/O pins to control the sensing of a single pad, an input signal, a switching signal, a discharge signal, and an interrupt signal. Because typical microprocessors such as the one disclosed in Taylor have only a small number of pins to accommodate pad connections, complicated switching circuits are usually needed to connect all of the pads to the microcontroller. For example, in a second embodiment, Taylor discloses a multiplexed pad design wherein less than one microcontroller I/O pin per pad is required. However, complicated switching and threshold detector circuits are required. Other prior art systems that require the use of multiplexer and other circuits external to a microcontroller to overcome I/O pin limitations are U.S. Pat. Nos. 4,698, 460; 4,698,461; 4,707,845; 4,733,222; 4,772,874; 5,012, 124; 5,053,757; 5,130,661; 5,270,710; 5,386,219; 5,463, 388; 5,469,364; and 5,594,222.

A further limitation is that the circuit disclosed in Taylor is generally operable for only a single type of application, since the complex switching logic requires that I/O pins be dedicated to special purpose tasks. I/O pins thus must be reassigned, and the microcontroller firmware must be redesigned before another type of application may be accommodated.

Other known capacitive sensitive switches (such as those disclosed in U.S. Pat. Nos. 4,707,845; 5,012,124; 5,053,757; 5,072,427; 5,270,710; 5,386,219; 5,463,388; 5,565,658; and 5,594,222) use a tuned circuit or a high-frequency oscillator. A physical object touching a pad changes the oscillator frequency, and the change in frequency is detected as a touch. Oscillator circuits usually require expensive discrete components.

Still other capacitive sensitive switches use a change in voltage to detect a touch. These circuits use an external comparator in a detection circuit such as that disclosed in U.S. Pat. No. 5,289,521 to compare the voltage from the touch pad with a voltage from a reference circuit. Both the comparator and the reference circuit add considerable expense to the overall cost of a circuit. The reference circuit also becomes unreliable as its components age or environmental conditions change.

Further capacitive sensitive elements such as those disclosed in U.S. Pat. Nos. 4,698,460; 4,698,461; 4,707,845; 4,733,222; 4,860,232; 5,012,124; 5,053,757; 5,130,661; 5,270,710; 5,386,219; 5,459,529; and 5,586,042 require the use of analog-to-digital or digital-to-analog converters. Such converters are expensive when used as components external to a microcontroller, and raise the cost of the microcontroller when integrated as part of the microcontroller.

Other capacitive sensitive switches may use touch pads comprised of two or more plate elements, which increases cost and complicates circuit routing.

Many prior art switches are also susceptible to random noise which affects the reliability of the switch. Such noise is difficult to eliminate when only one switch measurement can be made during a given time period.

Most known switches do not permit the simultaneous measurement of signal levels for plural touch pads. Of the few switches that do permit simultaneous measurement, most employ complex multiplexer circuitry and duplicate circuit elements external to the microcontroller. Such circuitry often requires active components or is subject to current leakage, particularly at high temperatures. Current leakage affects measurement accuracy. In addition, duplication of circuitry raises the cost of the switch system.

Some prior touch switch systems use microcontrollers to sense and record touch pad logic levels a predetermined number of times, and use a binary search algorithm to search all recorded RAM locations to determine when each touch pad has undergone a logic transition. For an eight bit I/O port, 64 bytes of RAM memory are typically required, and all such memory locations are thereafter accessed to determine when each I/O pin has transitioned from one logic level to another.

The present invention utilizes a single microcontroller, with multiple I/O ports, to support plural capacitive sensitive switches. Further, the trace length dependence has been reduced through three methods:

increasing the distance between each trace length and the surrounding ground plane, thereby reducing the coupling capacitance between the ground plane and the traces;

staggering the starting iterations for the discharges on touch pads that discharge more quickly than others so that all pads ultimately discharge to a logic level 0 on about the same measurement iteration, thereby greatly decreasing RAM requirements; or using remote 74HCT245 transceivers to limit the capacitive dependent trace lengths since the transceivers generate digital logic at their output. Consequently, the need for extra communication software between microcontrollers is eliminated and hardware costs are reduced since a single larger microcontroller, even with outlying transceivers, is cheaper than multiple smaller microcontrollers.

Staggering the starting iterations for the capacitive sensitive touch pad discharge has the added benefit of noise reduction since each capacitive element is more likely to experience the same environmental factors during the terminal, and most critical phase, of its decay—a transition in logic states.

While staggered discharge start times and the use of 74HCTZ45 transceivers are mutually exclusive on an I/O port, they do help accomplish the same goal of narrowing the iteration interval over which the I/O port's pins undergo logic level transitions.

The present invention also addresses the problem of potentially large RAM requirements by developing a measurement method that records only the changes in the recorded logic levels at a port and their respective transition times. This process is particularly well suited to faster microcontrollers and, for an eight bit I/O port, requires at most 16 bytes of RAM rather than the 64 bytes of RAM as occurs in some prior systems. Referring to Table I below, the method of recording only logic transitions in an I/O port and the time of their occurrence would result in a table similar to the following:

TABLE I

| Iteration | Binary Port Value |
|---|---|
| 7 | 11111011 |
| 9 | 11011011 |
| 11 | 11011001 |
| 12 | 01011001 |
| 14 | 01000001 |

This recording method of the present invention also accommodates the extraction of the actual transition values more quickly than in the prior art. Further, in the present invention, staggering the starts of the discharge cycles for the affected pads decreases the size of the RAM to be searched, thus speeding the search cycle which otherwise would account for a majority of the touch switch process time.

The use of the 74HCT245 transceivers also allows for the use of a single 8-bit I/O port to perform measurements sequentially on multiple groups of touch switches or for other I/O operations.

Rather than using square cornered touch pads which may increase the likelihood of charge coupling between touch pads, the present invention uses touch pads with rounded corners to reduce the coupling between touch pads. The present invention further utilizes a single conductive plate as the capacitive element, and adds a ground plane to provide further noise reduction. In addition, guard rings are employed to inhibit responses to spurious inputs.

Finally, the present invention extends the above innovations to include interdigitated capacitive sensitive elements whose simultaneous readings can be used to assign one of a plurality of values to a single touch while reducing the effects of noise.

It would thus be desirable to provide a low cost capacitive sensitive switch system which requires fewer circuit components, which is less susceptible to random noise or current leakage problems, which has reduced RAM requirements, and is more reliable than prior touch switch systems, which may be easily modified to adapt to changing environmental conditions and application requirements, and which will accommodate the simultaneous measurement of signal levels of plural touch pads or capacitive elements.

SUMMARY OF THE INVENTION

A capacitive sensitive switch system and method is disclosed which comprises a programmable microcontroller with multiple I/O ports, each consisting of multiple I/O pins, with each I/O pin having an attached capacitive sensitive element. Each capacitive sensitive element is operable to produce an effective capacitance upon being touched by a physical object such as a human finger. The microcontroller first places each I/O pin of each I/O port in an output mode to set a logic level on the associated capacitive element, and thereby establishes a transient voltage on each capacitive sensitive element which is different from its preferred voltage state. The voltages associated with each capacitive sensitive element's preferred and transient states depend upon whether the capacitance element is normally pulled to the microcontroller's operating voltage, or to ground, or to some other circuit voltage. Each capacitive sensitive element may have a different preferred voltage state.

The microcontroller reads the logic levels on a selected I/O port, and hence on the attached capacitive sensitive elements, for a predetermined number of iterations. The readings are made for a minimum number of iterations during which the capacitive sensitive elements transition from the voltage state imposed by the microcontroller to their preferred voltage state.

At specific iterations in the iterative cycle the microcontroller switches selected pins of the selected I/O port from output mode to input mode. Only then can the associated capacitive sensitive elements begin their transition to their preferred logic levels. The staggered iterations, at which certain capacitive sensitive elements are switched from output mode to input mode, are chosen so that all capacitive sensitive elements reach their preferred logic levels as simultaneously as is possible within the granularity of the microcontroller's operating program and instruction set. Since all capacitive sensitive elements transition within a narrow band of logic level readings, less RAM storage is required to record these events. In fact, the microcontroller need not record any I/O port readings until shortly before the common transition point. The microcontroller computes the number of recorded iterations that occur before each capacitive sensitive element reverts to its preferred state. Touching a capacitive sensitive element causes it to revert to its preferred state after a different number of recorded iterations than that of the untouched state.

In one aspect of the invention, the I/O ports with attached capacitive sensitive elements that are not being measured during a current measurement cycle are transitioned simultaneously with the measured I/O port so as to reduce the coupling capacitance among the capacitive sensitive elements that are transitioning to the same preferred voltage level, and to accentuate the coupling capacitance among capacitive sensitive elements that are transitioning to different preferred voltage levels. The benefit for elements that transition to the same preferred voltage level is that influences on one capacitive sensitive element, such as undesirable contaminants, are less likely to affect another element. The benefit for oppositely charged elements, or elements transitioning to different preferred voltage levels, is most apparent when the elements are interlocked as with interdigitated capacitive sensitive elements. That is, touching one element shortens the transition time of the other, thus increasing the difference in the transition times between the two elements.

In a further aspect of the invention, and mutually exclusive from the staggered iteration aspect, a single I/O port is multiplexed via multiple 74HCT245 transceivers to allow for the measurement of multiple groups of pads without requiring multiple microcontrollers. The transceiver configuration allows for simultaneous transitioning of all capacitive sensitive elements, but all touch pads on a single transceiver must simultaneously either charge or discharge if all capacitive sensitive elements attached to a single transceiver are to be measured simultaneously.

In a still further aspect of the invention, staggered transition logic levels of capacitive sensitive elements are initially read for a predetermined number of iterations and stored sequentially in a memory array of the microcontroller. This initial sequence of nominal readings represents a condition of "No Touch" for the capacitance elements. The memory array index at which the logic value for capacitive element "i" changes state is stored as the value "$A_i$". Subsequently, a new sequence of readings is stored in the memory array through the same measurement process. The memory array index at which the logic value for capacitive element "i" in the new sequence changes states is stored as the value "$B_i$". The signed difference, "$B_i$"−"$A_i$", is then compared to a threshold value. If the difference exceeds the threshold, a "Touch" signal is generated for capacitive element "i". Otherwise, a "No Touch" signal is optionally generated.

In yet a further aspect of the invention, a capacitive sensitive switch comprised of a single microcontroller with multiple I/O ports, each port having multiple I/O pins, and each I/O pin connected to a capacitive sensitive element and a grounded discharge resistor, simultaneously measures the logic level of all I/O pins of a selected one of the multiple I/O ports to detect a touch without need of any diodes, comparators, A/D or D/A converters, multiplexer circuits, tuned circuits or other complex switching circuitry external to the microcontroller.

In another aspect of the invention, the capacitance of the trace lengths connecting I/O ports of the single microcontroller to their associated capacitive sensitive elements or touch pads are substantially reduced by extending as far as reasonably possible, without affecting touch detection accuracy, the distance between the traces and a surrounding ground plane. The effect of trace capacitance on touch measurements is further reduced by staggering the discharge start times of the touch pads of an I/O port so that all the touch pads discharge to a logic 0 state at substantially the same time, or by using transceivers to geometrically group touch pads so that their trace lengths to the transceiver are substantially equal to within 10%.

In still another aspect of the invention, RAM memory requirements of the microcontroller are substantially reduced by using a processing method which requires that only logic level transitions of I/O pins of a selected I/O port be recorded and accessed to determine whether a selected one of the I/O pins has undergone a logic level transition, and by staggering the start of discharge times of all of the I/O pins of the selected I/O port so that all of the I/O pins discharge to a logic 0 state at substantially the same time.

In yet another aspect of the invention, the touch pads have rounded corners to reduce charge coupling between the touch pads, and guard rings are used to reduce the likelihood of touch detection in response to spurious input signals to the microcontroller.

BRIEF DESCRIPTION OF THE DRAWINGS

The accompanying drawings, which are incorporated in and constitute a part of the specification, illustrate preferred embodiments of the invention, and together with the general description given above and the detailed description of the preferred embodiments given below, serve to explain the principles of the invention.

FIG. 6b illustrates magnified 6-mil circuit board traces comprising the conceptual touch pads of FIG. 6a;

DESCRIPTION OF PREFERRED EMBODIMENTS

The features, advantages and objects of the invention will become more readily apparent from the following detailed descriptions when taken in conjunction with the drawings as described above.

Figure 1:
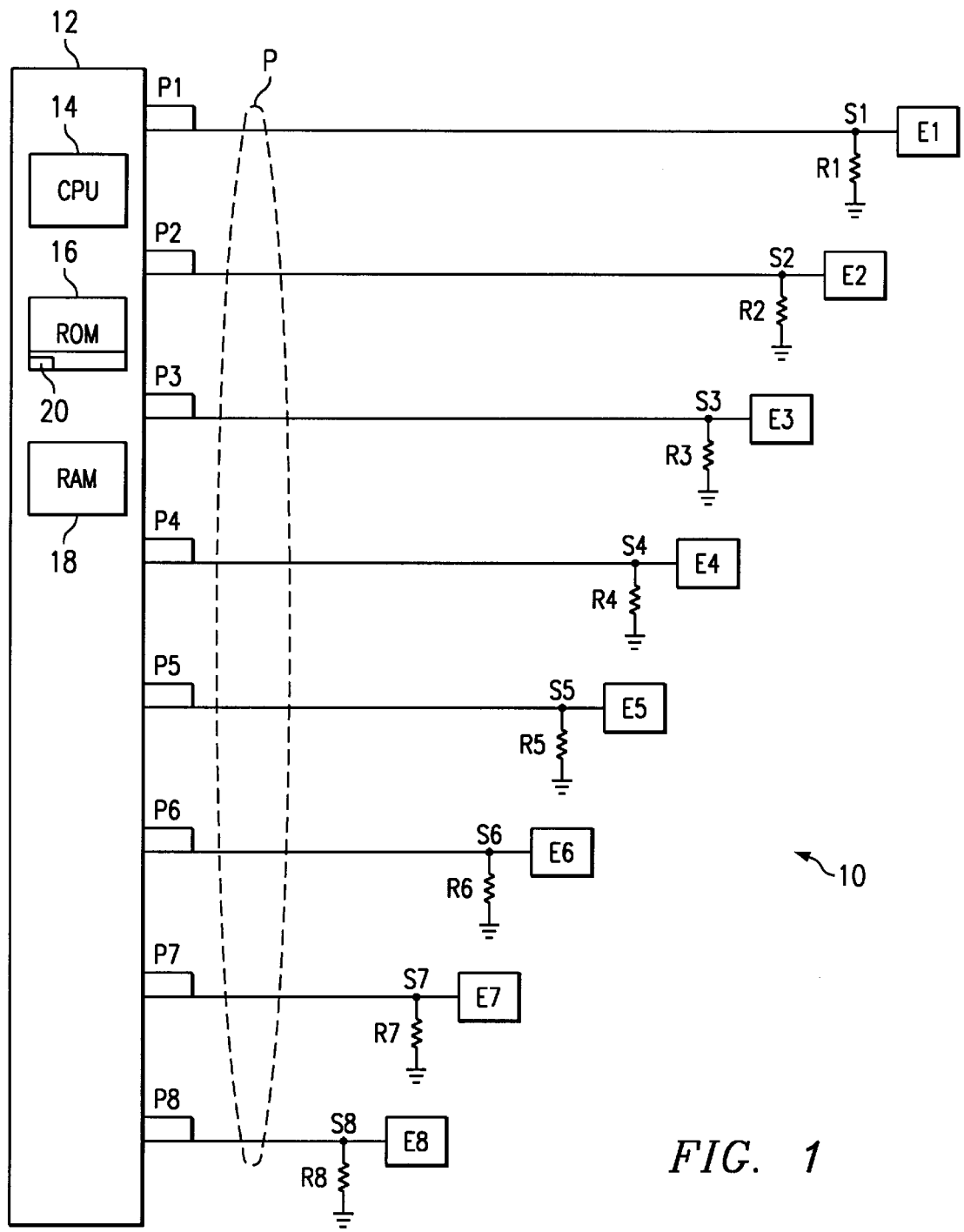
FIG. 1 is a schematic diagram of a switch according to a first embodiment of the present invention.
Figure 6A:
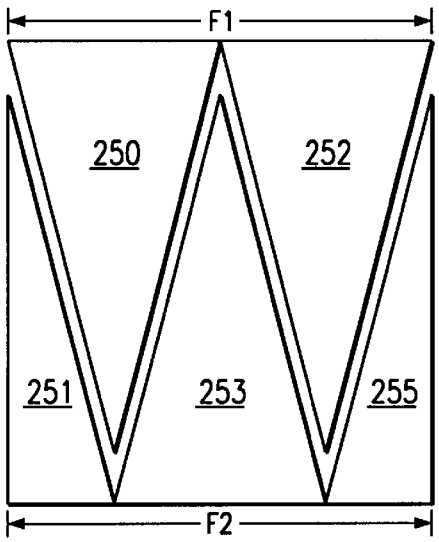
FIG. 6a conceptualizes interdigitated capacitive sensitive elements or touch pads.

The FIGS. 1, 6a, and 6b to the extent of the illustrations that are shown are in the prior art. New functionalities which have been added to the above embodiments and that are described below, however, are covered by the claims and are not in the prior art.

First Embodiment

Referring to the drawings, and initially to FIG. 1 thereof, a programmable capacitive sensitive switch 10 is illustrated which includes a microcontroller 12 having a central processing unit (CPU) 14, a read only memory (ROM) 16, and a random access memory (RAM) 18. Application software 20 is stored in the ROM 16 for execution by the microcontroller. Microcontroller 12 preferably is a Zilog Z8 microcontroller, and includes a port P connected to capacitive sensitive elements or touch pads $E_1$ through $E_8$ by way of signal lines $S_1$ through $S_8$, respectively. While an eight bit port is illustrated in FIG. 1 and described herein, it is to be understood that other I/O ports having more or less output pins may be accommodated. In the preferred embodiment, port P is bi-directional, with each port pin ($P_1$–$P_8$) being capable of being read from (input) and written to (output). In addition, port P has a high impedance when in input mode without any pull-up resistors, or an auto-latch feature. Further, the microcontroller can simultaneously read or write all pins on an I/O port such as port P. Additionally, the microcontroller can switch all I/O ports between write mode and read mode within a few instructions, typically one or two per port.

Resistors $R_1$ to $R_8$ respectively connect touch pads $E_1$ through $E_8$ to a preferred voltage level (cirucit ground in FIG. 1), and are directly connected to the pins ($P_1$–$P_8$) of port P of microcontroller 12. Each touch pad has a preferred voltage level, which may be the circuit's ground, the circuit's operating voltage, or some other voltage. The port pins are then driven to establish a transitional voltage state on the touch pads at variance with the preferred voltage state. The microcontroller measures the number of iterations required before the pads transition back to their preferred voltage state. Since the microcontroller port P can only read logic 1 and logic 0 values, all voltage states represent one or the other of these binary values.

The touch pads $E_1$ through $E_8$ are as used in common household appliances such as cook tops, and generate a control signal in response to the touching of a touch pad to control the appliance. Such touch pads have rounded corners to reduce charge coupling between pads as will be explained in more detail below. Representative of such touch pads is that having part number 20-1222-01, manufactured by Tanisys Technology, Inc. of Austin, Tex. The resistors $R_1$ through $R_8$ are each of a resistance of 2 megaohms when the touch surface is 3/16 inch thick glass. Experience has shown that the ground plane surrounding the traces to pads $E_1$ through $E_8$ should come no closer than 25 mils when 6 mil traces are being used.

Figure 2:
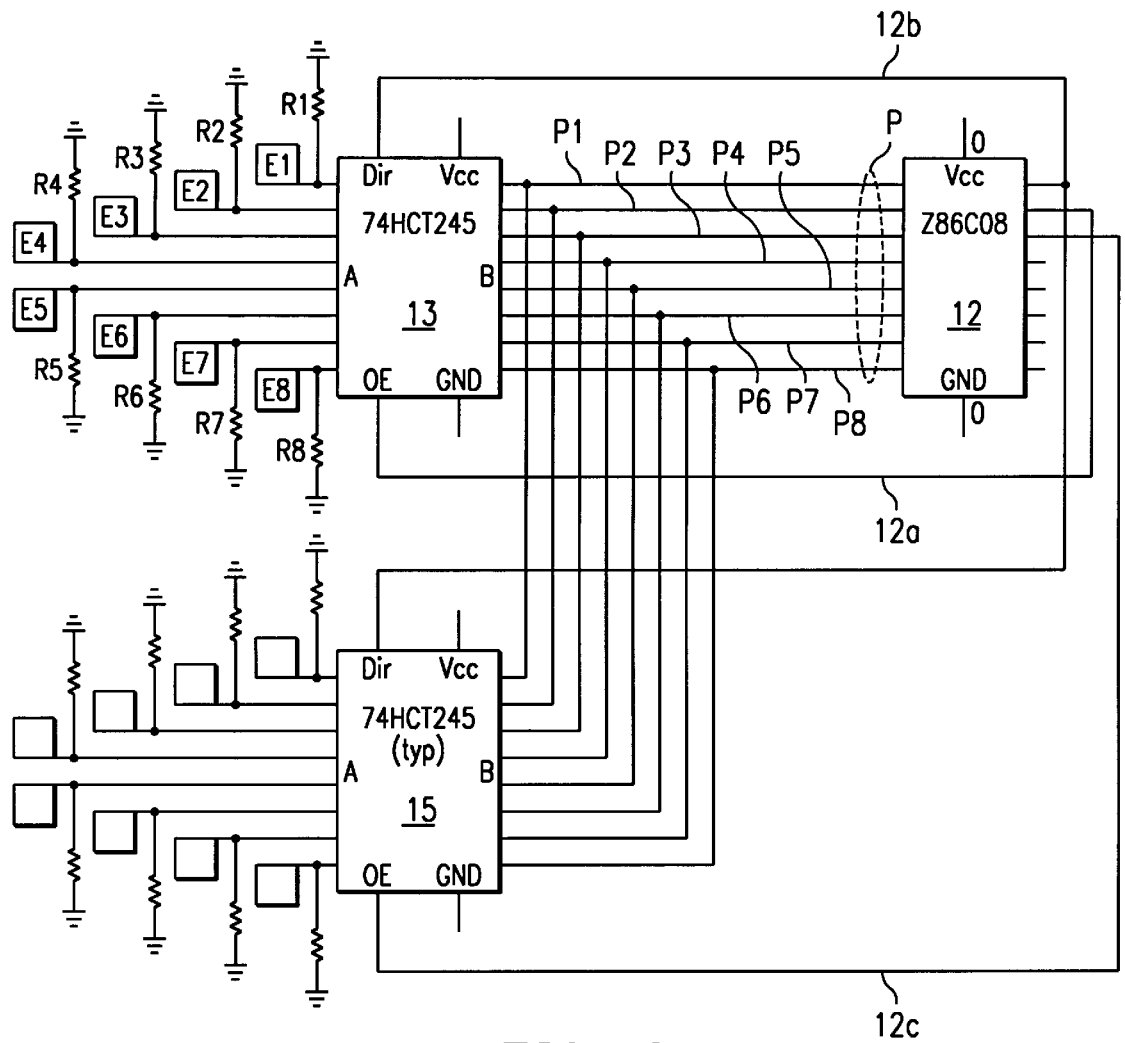
FIG. 2 is a schematic diagram of a switch system employing bi-directional transceivers to accommodate plural touch pad arrays with a limited number of microcontroller I/O pins.

In the event that port P has associated pull-up resistors when in input mode, a digital I/O transceiver such as the 74HCT245 manufactured by Philips of The Netherlands, can be used to interface between the resistors and the port pins as illustrated in FIG. 2. Microcontroller 12 is shown connected by an array of pins $P_1$ through $P_8$ to I/O port B of octal bus transceivers 13 and 15, respectively. The I/O port A of the transceiver 13 is connected to touch pads $E_1$–$E_8$ that in turn are connected to ground by way of resistors $R_1$–$R_8$ as before described in connection with the description of FIG. 1. The I/O port A of transceiver 15 is similarly connected to a second group of touch pads.

Thus, the microcontroller 12 in combination with the transceivers 13 and 15 may accommodate up to two banks of touch pads with eight pads each. Additional microcontroller port pins are required, however, to enable the transceiver chips as indicated by lines 12a and 12c, and to toggle the transceiver's I/O direction periodically between read and write as indicated by line 12b.

With the addition of the transceivers, the microcontroller's I/O pins $P_1$–$P_8$ can be used for other tasks such as communications as well as the measurement of touch pad voltage levels. For example, the microcontroller 12 may use the I/O ports to sequentially measure touch sensitive switches during one time interval and regular membrane switches in another time interval. This allows the addition of touch switches to devices such as keyboards, without increasing the number of microcontroller I/O pins required to perform both tasks.

Port P may also have Schmitt triggered inputs. Such inputs provide a theoretical advantage computationally, because they reduce the likelihood that a signal may be recorded as decaying to a logic 0 state and thereafter because of noise suddenly return to a logic 1 state.

A touch sensor switch provides several energy storage mechanisms. More particularly, the capacitance of the switch system flows from three difference sources: the touch pad's native or intrinsic capacitance; the circuit trace's coupling capacitance; and, the capacitance of the attached electronic component(s). The present invention addresses methods of reducing circuit trace coupling while controlling the pad's native capacitance.

The conductive plate of the touch pad has an intrinsic capacitance that is theoretically computable as a circular disk in air. In practice, such theoretical computations are much lower than actual measurements on operating systems for several reasons. The touch pad is actually embedded as a copper area in an FR-4 circuit board or printed using conductive ink (carbon or silver) on a piece of Mylar. Both carrier materials have dielectric constants greater than air, and tend to raise the capacitance of the touch pad. In addition the exposed side of the touch pad is usually glued or otherwise attached to a touch surface such as glass or plastic. Again these materials have dielectric constants greater than air, and thus increase the capacitance of the touch pad. Also the reverse side of the Mylar or FR-4 circuit board is typically backed with a ground plane (integral or attached) to guard against spurious noise entering the system. The ground backing material provides yet another energy storage mechanism for the touch pad.

While the capacitance of the circuit traces by themselves is small, each trace is surrounded by a planar ground plane on both sides, and is positioned over the grounded backing material to collectively create a significant capacitance.

Finally, the electronic components connecting to the touch pad's trace have their own intrinsic capacitance, amounting to as much as 10 pF, or 10 to 20% of the total system capacitance.

Several features were added to the invention to improve the resolution of the touch identification process. By way of example, the ground plane of the system of FIG. 1 was distanced from the touch pads $E_1$–$E_8$, and the corners of the touch pads $E_1$–$E_8$ were rounded to inhibit coupling of charges between the touch pads. According to electric field theory, charges are concentrated in the corners of touch pads. Thus, by rounding the corners, a charge singularity is removed, and the distance between touch pad corners is increased to reduce the likelihood of charge coupling.

Another feature to protect against the effect of extraneous or unwanted touching is the addition of guard ring touch pads. That is, a number of the touch pads can be arranged about the primary touch pads to inhibit the output commands of the microcontroller 12 in the event any one of the guard ring touch pads is touched. By way of example, the touch pads $E_1$, $E_2$, $E_7$ and $E_8$ may form an outer guard ring protecting the inner touch pads $E_4$, $E_5$, and $E_6$. The inhibition of the microcontroller outputs will continue until the source of the guard ring touching is removed or a predetermined time period has elapsed.

Figure 3:
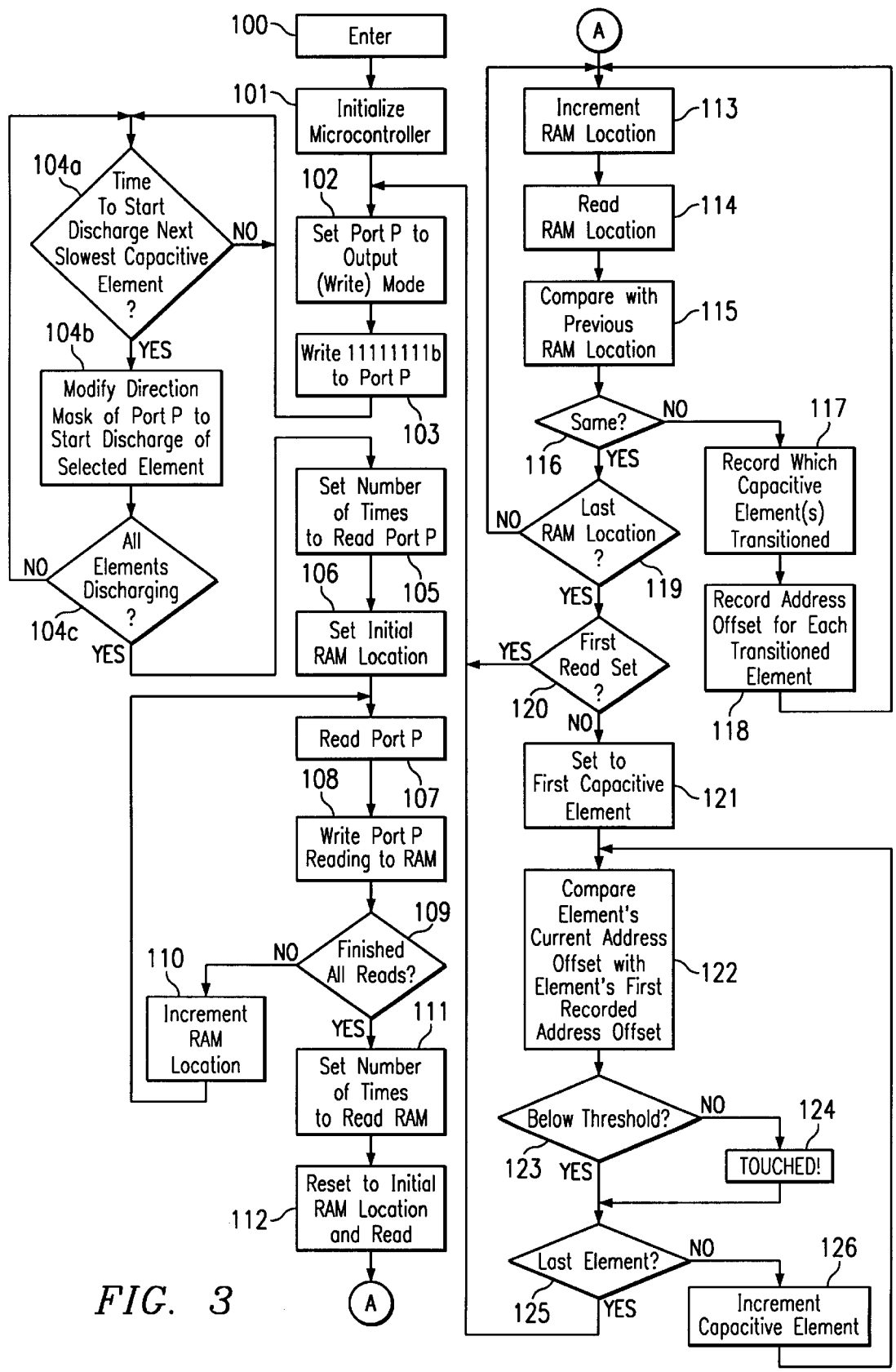
FIG. 3 is a logic flow diagram of a program which is executed by the microcontroller 12 of FIG. 1 to identify a transition in the logic level of plural touch pads.

FIG. 3 illustrates a logic flow diagram for the program 20 stored in ROM 16. Program 20 controls the operation of microcontroller 12, whereby the touch of a touch pad ($E_1$–$E_8$) by an operator, or even a grounded physical object in close proximity with a touch pad, is detected.

Upon reset or power-up, the microcontroller 12 enters the program at logic step 100, and thereafter the logic flow proceeds to logic step 101 to initialize the microcontroller to a known state by clearing all registers and memory locations. At logic step 102, the port P is set to the output or write mode in preparation for writing the 8-bit binary value 11111111b to port P at logic step 103. The I/O pins of the port P thereby are simultaneously charged.

There is a one-to-one correspondence between each bit of a port P data word and its associated capacitive element. Thus the write operation sets a logic 1 value on each associated signal line, $S_1$ to $S_8$, thereby causing each line to charge its associated capacitance element, $E_1$ to $E_8$, to the operating voltage of the circuit. The operating voltage for a Zilog Z86C08 as microcontroller 12 is between 3.0 and 5.5 volts. Other microcontrollers can operate at lower or higher voltages.

A typical microcontroller has a small number of 8-bit or 16-bit ports. The Zilog Z86C08 microcontroller has one 8-bit port (port P) and two 3-bit ports.

To the microcontroller, the capacitive elements or touch pads, $E_1$ to $E_8$, appear to charge very quickly since their time constants (the product of the circuit's resistance and capacitance) are small compared to the microcontroller's instruction cycle time of approximately 750 nanoseconds. Thus, by the time the logic flow process of FIG. 3 is ready to execute its next instruction, the touch pads $E_1$–$E_8$ are fully charged. Otherwise the microcontroller could optionally delay its substantive instructions for a period of time with the use of NOP (no operation) instructions or wait loops.

From logic step 103 of FIG. 3, the logic flow process continues to logic step 104a where it is determined whether this is the proper iteration to start the discharge cycle of a next slowest I/O pin under consideration. If not, the logic flow process iterates until the proper iteration to start that pin's discharge cycle. Thereafter, the logic flow process proceeds to logic step 104b to modify the direction mask of the I/O port to start the discharge of the selected capacitive sensitive element or touch pad.

The logic flow process then continues from logic step 104b to logic step 104c to determine whether all capacitive sensitive elements of the selected I/O port have begun discharging. If not, the logic flow process cycles back to logic step 104a to continue as before described. If all of the capacitive elements are found to have commenced to discharge at logic step 104c, however, the logic flow proceeds to logic step 105.

As a result of the logic steps 104a–104c, the discharge cycle starting iteration for each capacitive element is staggered such that all elements finish discharging on the same iteration, within the limits and resolution of the microcontroller's ROM program. This approach utilizes the microcontroller's I/O port mask which controls, on an individual I/O pin basis, when each pin starts its discharge. In this case, the ROM program sequentially writes a sequence of port masks. The effect of writing these masks is to stagger the discharge starting iterations for each capacitive sensitive element. Writing the correct I/O port mask sequence aligns the capacitive element discharge starting iterations such that all pads discharge to the logic 0 state during the same measurement iteration.

The most evident effect from this procedure is that considerably less RAM memory is required to store the read logic values. That is, the process compensates for the variations in capacitance among the various capacitive elements, and therefore fewer reads of the I/O port are required to record all I/O pin transitions.

Sample logic for establishing the array of staggered discharge starting iterations might proceed as follows:

1. Measure the number of iterations to a complete discharge under normal, untouched, conditions.
2. Based on these measurements create a sequence of 32 I/O port direction masks in RAM that set the direction I/O bit of a given pad so that it transitions during the same iteration as the slowest discharging pad.
3. Update every 1000 discharge cycles by comparing the current discharge iterations to the slowest pad.

For the preferred embodiment, a Zilog Z8, the discharge instructions would look like:

```
                                            PAD 12345678
ld   r6, RAM1    ; RAM1 contains the bits   00000001
ld   r6, RAM2    ; RAM2 contains the bits   11000001
ld   r6, RAM3    ; RAM3 contains the bits   11100001
ld   r6, RAM4    ; RAM4 contains the bits   11100101
...
                                            PAD12345678
ld   r6, RAM29   ; RAM29 contains the bits  11110101
ld   r6, RAM30   ; RAM30 contains the bits  11110111
ld   r6, RAM31   ; RAM31 contains the bits  11111111
ld   r6, RAM32   ; RAM32 contains the bits  11111111
```

In the example, Pad 6 normally transitions four iterations sooner than Pad 8, the slowest pad, so the microcontroller modifies the sequence of I/O port direction masks so that Pad 6 starts discharging four iterations after Pad 8 starts. This is illustrated by the contents of RAM1 wherein Pad 8 begins discharging, and by the contents of RAM4 wherein Pad 6 begins discharging.

In practice, changing a pad's discharge starting iteration may affect other nearby pads so an iterative process, carried out by the microcontroller, is typically necessary.

From logic step 104c, the logic flow continues to logic step 105 to set the number of iterations for reading port P initially to thirty-two, about half that of the prior art All I/O pins of port P are at this time discharging. The logic flow process thereafter proceeds to logic step 106 to establish the initial location in RAM 18 to store read values.

At logic step 107, the logic flow process initiates the repetitive process of reading port P, writing the read value to the designated location of RAM 18 at logic step 108, and thereafter determining if all reads have been performed at logic step 109.

If not, the address of the indicated location of RAM 18 is incremented at logic step 110 to the next sequential location of RAM 18 prior to repeating the logic step 107.

The data rate for performing logic steps 107 and 108 can vary considerably according to the type of read-write logic used and the clock rate of the circuit. Affordable 8-bit microcontrollers such as, the Atmel AVR family, which utilize current technology, can read port P, and write to RAM 18, as quickly as once every 150 nanoseconds using a 20 MHz clock rate. In the preferred embodiment disclosed herein, the Zilog Z86 microcontroller performs the read/write operation every 750 nanoseconds using a 16 MHz clock rate. Systems employing external discrete logic would be able to perform read/write operations at memory cycle data rates, typically 5 to 100 nanoseconds, depending on the type and cost of the memory used. The main advantage of higher clock cycles is the opportunity for much higher resolution in timing counts, and much smaller discharge resistor values. Higher clock rates allow for the accurate measurement of ever smaller capacitance should the technique be employed as part of a capacitance measuring system.

Upon completion of all of the read cycles indicated at logic step 105, the logic flow process proceeds from logic step 109 to logic step 111 to set the number of RAM 18 locations that must now be processed. During the execution of the loop comprised of logic steps 107–110, all I/O pins of the port P are discharged in a near simultaneous manner. Thereafter, the starting location for the processing is set at logic step 112, and the logic flow process continues through node A to logic step 113 where the previous memory location in RAM 18 is incremented.

At logic step 114, the eight bit value which indicates the logic levels of pins $P_1$–$P_8$, and which is stored in the new location in RAM 18, is read in preparation for a comparison at logic step 115 with the eight bit value stored in the previous RAM 18 location. It should be noted that a change in the current RAM 18 location's eight bit value, relative to the previous location's eight bit value, indicates that at least one capacitive element has changed its logic state. If it is determined at logic step 116 that the two consecutive RAM 18 locations contain unequal values, the logic flow process branches to logic step 117 to determine which bit(s) changed from a logic 1 state to a logic 0 state. Since each bit of the word written to port P at logic step 103 corresponds to a capacitive element, a changed bit indicates that the associated capacitive element decayed to a logic 0 prior to the recording of the value stored in the current RAM 18 location. From logic step 117, the logic flow continues to logic step 118 where the bits(s) that changed logic state are indicated by recording an offset with respect to the initial RAM 18 location, and associating the offset with a capacitive element. Thus, the offset represents the number of times port P was read before the designated capacitive element transitioned from a logic 1 to a logic 0. After logic step 118, the logic flow proceeds to logic step 113 to continue as before described.

The search steps described above represent a type of linear search. Other more efficient search methods are possible to determine transition points. Search techniques such as linear and binary searches are embodied by Microsoft Corporation of Redmond, Wash., in their "C" runtime "lsearch" and "bsearch" library routines, respectively.

If it is determined at logic step 116 that the current and previous RAM 18 locations contain equal values, no transition occurred during the period between their respective recordings, and the logic flow proceeds to logic step 119 to determine if the last RAM 18 location has been read. If not, the logic flow loops back to logic step 113 to proceed as before described. Once all RAM locations have been processed, the logic flow proceeds from logic step 119 to logic step 120 to determine if a previous read of port P data has occurred. If only a first read has occurred, offsets are determined in the absence of any touch stimuli, and the logic flow returns to logic step 102 to begin another measurement process as before described.

If the current reading of port P data is not the first, then the offset values represent candidate values (offsets that may have been computed in the presence of a touch stimulus), and the logic flow commences at logic step 121 to determine the presence or absence of touch stimuli in the candidate data. More particularly, the currently computed offset value for each capacitive element is examined beginning with the first capacitive element.

From logic step 121, the logic flow continues to logic step 122, where each candidate offset value is compared to its corresponding nominal offset value. The nominal offset values were previously recorded and computed under the assumption that no touch stimuli were present during the measurement process. In the presence of a touch, the candidate offset value will exceed the corresponding nominal offset value, and is likely to yield a difference of 6 or more in the presence of a touch.

After logic step 122, the logic flow continues to logic step 123 to determine whether the difference is greater than a predetermined threshold value which is set as a result of empirical data measurements obtained by observing the touch pad discharge times on an oscilloscope. If the difference exceeds the predetermined threshold, the logic flow proceeds from logic step 123 to logic step 124 to signal the occurrence of a touching of a touch pad, and thereafter continues to logic step 125. If the difference is less than the threshold value, the logic flow continues from logic step 123 to logic step 125 to determine if all capacitive elements have been examined. If not, the logic low increments to the next capacitive element at logic step 126, and thereafter returns to logic step 122 to continue as before described. If all of the capacitive elements or touch pads have been processed, the logic flow repeats the entire candidate measurement process by returning from logic step 125 to logic step 102.

Performing the port read and RAM write operation compensates for the fact that the more affordable microcontroller cannot both read and process a single port reading quickly enough to reliably detect a touch event. Thus, data is first recorded as rapidly as possible, and thereafter processed to detect data transitions. A faster microcontroller eliminates the necessity of recording the data from the port, since it can process the data for transitions while maintaining a high data read rate on port P.

Unlike the plural switches disclosed in the Taylor patent and most all other capacitive sensitive switches, the plural switches of FIG. 1 do not have either external switching logic, or external threshold detection circuits separate from microprocessor 12. Hence, plural switches in accordance with the present invention are much simpler and less costly than the plural switches of the Taylor patent, and require less RAM memory than similar prior systems for reading port values when the staggered discharge method is used.

Persons of ordinary skill in the art will recognize that the resistors $R_1$ to $R_8$ of FIG. 1 can pull the touch pads to an operating voltage level of the switch system, or to some other predetermined potential other than ground. The switch operation might then consist of writing a logic 0 to port P to discharge the capacitive elements $E_1$ to $E_8$ to ground, and then reading port P after using a staggered charge method, while writing the resulting logic levels to the RAM 18 as the capacitive elements recharge. Relevant logic level transitions would then be from logic 0 to logic 1.

TABLE II

| | CAPACITIVE ELEMENT | | | | | | | |
|---|---|---|---|---|---|---|---|---|
| ITERATION | 1 | 2 | 3 | 4 | 5 | 6 | 7 | 8 |
| 1 | 1 | 1 | 1 | 1 | 1 | 1 | 1 | 1 |
| 2 | 1 | 1 | 1 | 1 | 1 | 1 | 1 | 1 |
| 3 | 1 | 1 | 1 | 1 | 1 | 1 | 1 | 1 |
| 4 | 1 | 1 | 1 | 1 | 1 | 1 | 1 | 1 |
| 5 | 1 | 1 | 1 | 1 | 1 | 1 | 0 | 1 |
| 6 | 1 | 1 | 1 | 1 | 1 | 1 | 0 | 1 |
| 7 | 1 | 1 | 1 | 1 | 1 | 0 | 0 | 1 |
| 8 | 1 | 1 | 1 | 1 | 1 | 0 | 0 | 1 |
| 9 | 1 | 1 | 0 | 1 | 1 | 0 | 0 | 1 |

TABLE II-continued

| | CAPACITIVE ELEMENT | | | | | | | |
|---|---|---|---|---|---|---|---|---|
| ITERATION | 1 | 2 | 3 | 4 | 5 | 6 | 7 | 8 |
| 10 | 1 | 1 | 0 | 1 | 1 | 0 | 0 | 1 |
| 11 | 1 | 1 | 0 | 1 | 1 | 0 | 0 | 1 |
| 12 | 0 | 1 | 0 | 1 | 1 | 0 | 0 | 1 |
| 13 | 0 | 1 | 0 | 1 | 1 | 0 | 0 | 1 |
| 14 | 0 | 1 | 0 | 0 | 0 | 0 | 0 | 1 |
| 15 | 0 | 1 | 0 | 0 | 0 | 0 | 0 | 1 |

TABLE III

| | CAPACITIVE ELEMENT | | | | | | | |
|---|---|---|---|---|---|---|---|---|
| ITERATION | 1 | 2 | 3 | 4 | 5 | 6 | 7 | 8 |
| 1 | 1 | 1 | 1 | 1 | 1 | 1 | 1 | 1 |
| 2 | 1 | 1 | 1 | 1 | 1 | 1 | 1 | 1 |
| 3 | 1 | 1 | 1 | 1 | 1 | 1 | 1 | 1 |
| 4 | 1 | 1 | 1 | 1 | 1 | 1 | 1 | 1 |
| 5 | 1 | 1 | 1 | 1 | 1 | 1 | 1 | 1 |
| 6 | 1 | 1 | 1 | 1 | 1 | 1 | 1 | 1 |
| 7 | 1 | 1 | 1 | 1 | 1 | 0 | 1 | 1 |
| 8 | 1 | 1 | 1 | 1 | 1 | 0 | 1 | 1 |
| 9 | 1 | 1 | 0 | 1 | 1 | 0 | 1 | 1 |
| 10 | 1 | 1 | 0 | 1 | 1 | 0 | 1 | 1 |
| 11 | 1 | 1 | 0 | 1 | 1 | 0 | 0 | 1 |
| 12 | 0 | 1 | 0 | 1 | 1 | 0 | 0 | 1 |
| 13 | 0 | 1 | 0 | 1 | 1 | 0 | 0 | 1 |
| 14 | 0 | 1 | 0 | 0 | 0 | 0 | 0 | 1 |
| 15 | 0 | 1 | 0 | 0 | 0 | 0 | 0 | 1 |

Tables II and III are tabular illustrations of consecutive readings of 15 iterations each of the capacitance elements $E_1$ to $E_8$. Table II represents nominal measurements in the absence of a touch. Table III represents candidate touch measurements. Each bit corresponds to a logic level of a single capacitance element, $E_1$ to $E_8$. The logic levels transition between a logic 1 and a logic 0 value. For example, in the first entry of Table II all eight bits are at a logic 1, thus indicating that all eight (8) capacitance elements $E_1$ to $E_8$ are at a logic 1. In the entry 11 of Table II, the third, sixth and seventh bits are at a logic 0 which indicates that capacitance elements $E_3$, $E_6$, and $E_7$ are at a logic 0, and have transitioned from a logic 1 to a logic 0 state during the current or a previous measurement cycle.

Table II further illustrates the execution of logic steps 115 and 116 of FIG. 3 where the byte value at the immediately proceeding RAM position is compared with the byte value at the current RAM position. By way of example, comparing the byte value of entry 5 with the byte value of entry 4, capacitive element 7 is seen to have transitioned from a logic 1 state to a logic 0 state. Following logic steps 117 and 118, the transition iteration number "5" is associated with the capacitive element 7.

Table II also illustrates the process by which logic steps 122 and 123 determine if a capacitive element has been touched. For example, capacitance element $E_7$ transitions from a logic 1 to a logic 0 as illustrated at entry 5 in the absence of a touch. The nominal offset value for capacitive element 7 thus becomes 5, which corresponds to the transition iteration number where a logic transition occurred.

In contrast, the data in Table III indicates that capacitive element $E_7$ has likely been touched since no transition from logic 1 to logic 0 occurs until iteration 11. The signed difference between the two iteration numbers 11 and 5 is 6, which is compared against a predetermined threshold value to make a touch/no-touch determination.

Second Embodiment

While the foregoing description of a preferred embodiment refers to microcontroller 12 and a logic flow process, persons skilled in the art will recognize that microcontroller 12 and the logic flow process may be embodied in an application specific integrated circuit (ASIC).

Figure 4:
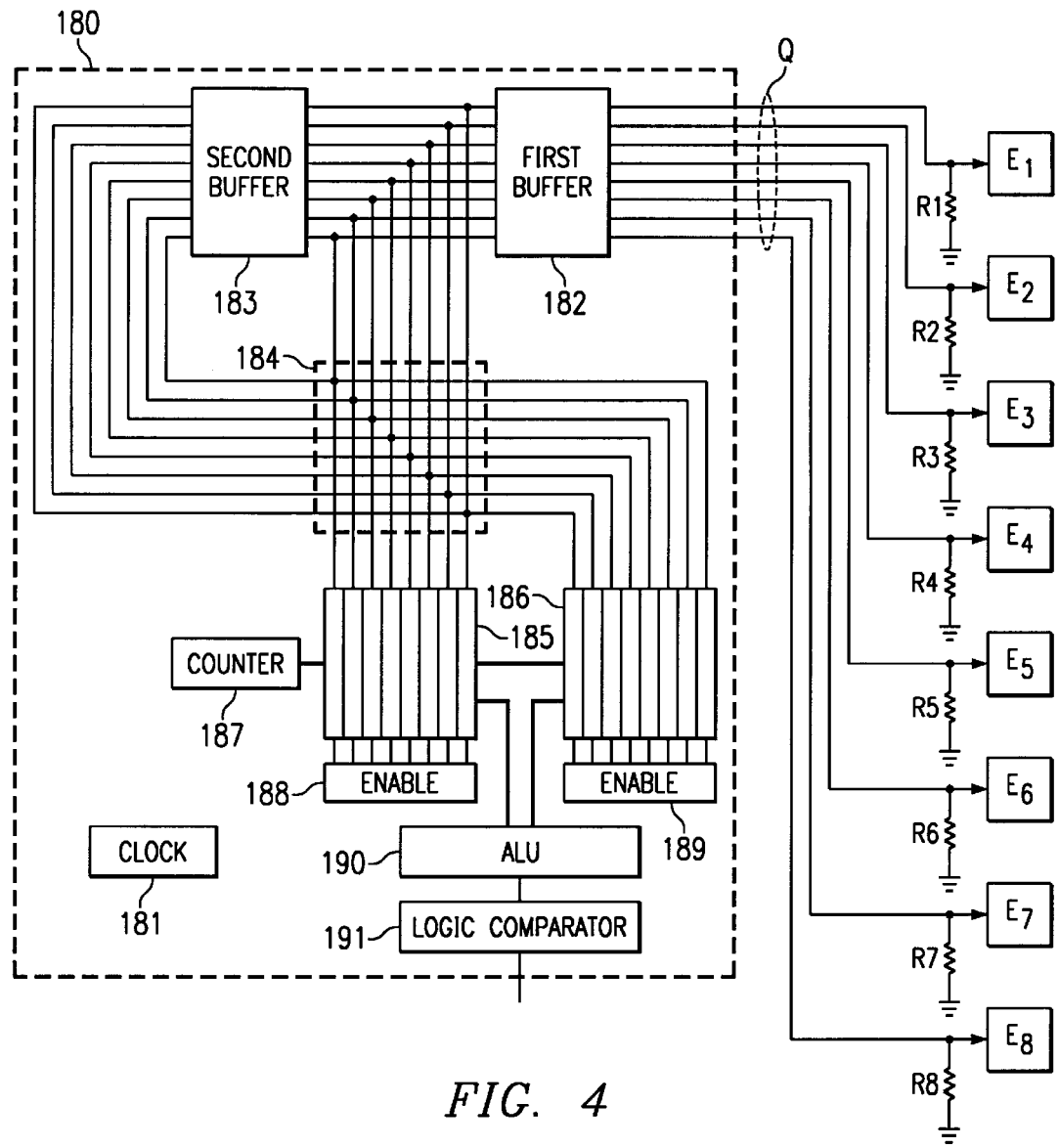
FIG. 4 is a schematic diagram of an ASIC chip embodiment of the present invention.

Referring to FIG. 4, an ASIC 180 is shown to have replaced the microcontroller 12 of FIG. 1. ASICs typically include clock circuitry, exemplified by Clock 181, that drive the remaining circuit components. The Clock 181 connections to the individual ASIC components, and the specific timing logic necessary to drive ASIC 180, have been omitted for clarity. Such information is available, however, from ASIC manufacturers.

ASIC 180 includes a clocked bi-directional first buffer 182 whose external port pins are coupled by way of connection Q to capacitance elements $E_1$ to $E_8$. ASIC 180 begins a measurement process by switching first buffer 182 and its external port pins to output mode, and setting a predetermined logic level on the pins. A known voltage is thereby established across capacitance elements $E_1$ to $E_8$. After a predetermined number of clock cycles, ASIC 180 switches first buffer 182 to a high-impedance input mode. While in input mode, the external port pin logic levels are clocked into first buffer 182. On subsequent clock cycles, the previous contents of the first buffer 182 are clocked into a second buffer 183, and into a comparison circuit 184. On each clock cycle, the contents of second buffer 183 are output to the comparison circuit 184 for bit comparison against the contents of first buffer 182. If a corresponding bit from first buffer 182 and second buffer 183 differ, the output of circuit 184 enables a particular storage element of nominal storage unit 185 and a corresponding storage element of a candidate storage unit 186. This enablement allows a counter 187 to deposit its contents reflecting the iteration count into the particular storage element of nominal storage unit 185, and the corresponding storage element in candidate storage unit 186. This sequence of operations has the effect of comparing two consecutive external port pin signal measurements, and recording the iteration count at which any bit transitions from one logic state to another. Since each bit corresponds to the logic state of one of the capacitive elements $E_1$ to $E_8$, the effect is to record the transition iteration count for each element.

After a fixed number of clock cycles that is selected for ensured accuracy in a particular operating environment, the circuit 184 resets the counter 187, and sets a nominal enable 188 and a candidate enable 189, so that a stored value from each of the storage units 185 and 186 is loaded into an ALU 190 to determine the difference between the values. The difference is then clocked to a logic comparator 191, where a binary decision of touch or no-touch is made. On a first iteration, the contents of each storage element of the candidate storage unit 186 are equal to the corresponding contents of each storage element of the nominal storage unit 185. Consequently, all touch decisions during the first iteration are no-touch decisions.

ASIC 180 next sets first buffer 182 to output mode in preparation for repeating the above measurement process. During a second pass, however, the nominal enable 188 changes state, and the enabling operation of comparison circuit 184 is disabled for nominal storage unit 185. The enabling operation of circuit 184 is not disabled, however, for the candidate storage unit 186. When the above described process is repeated, therefore, the contents of an updated storage element of candidate storage unit 186 are loaded into ALU 190 along with the unchanged contents of a corresponding storage element in nominal storage unit 185. The difference will be non-zero in the presence of a touch, which will be reported by the logic comparator 191.

Noise Elimination

Figure 5:
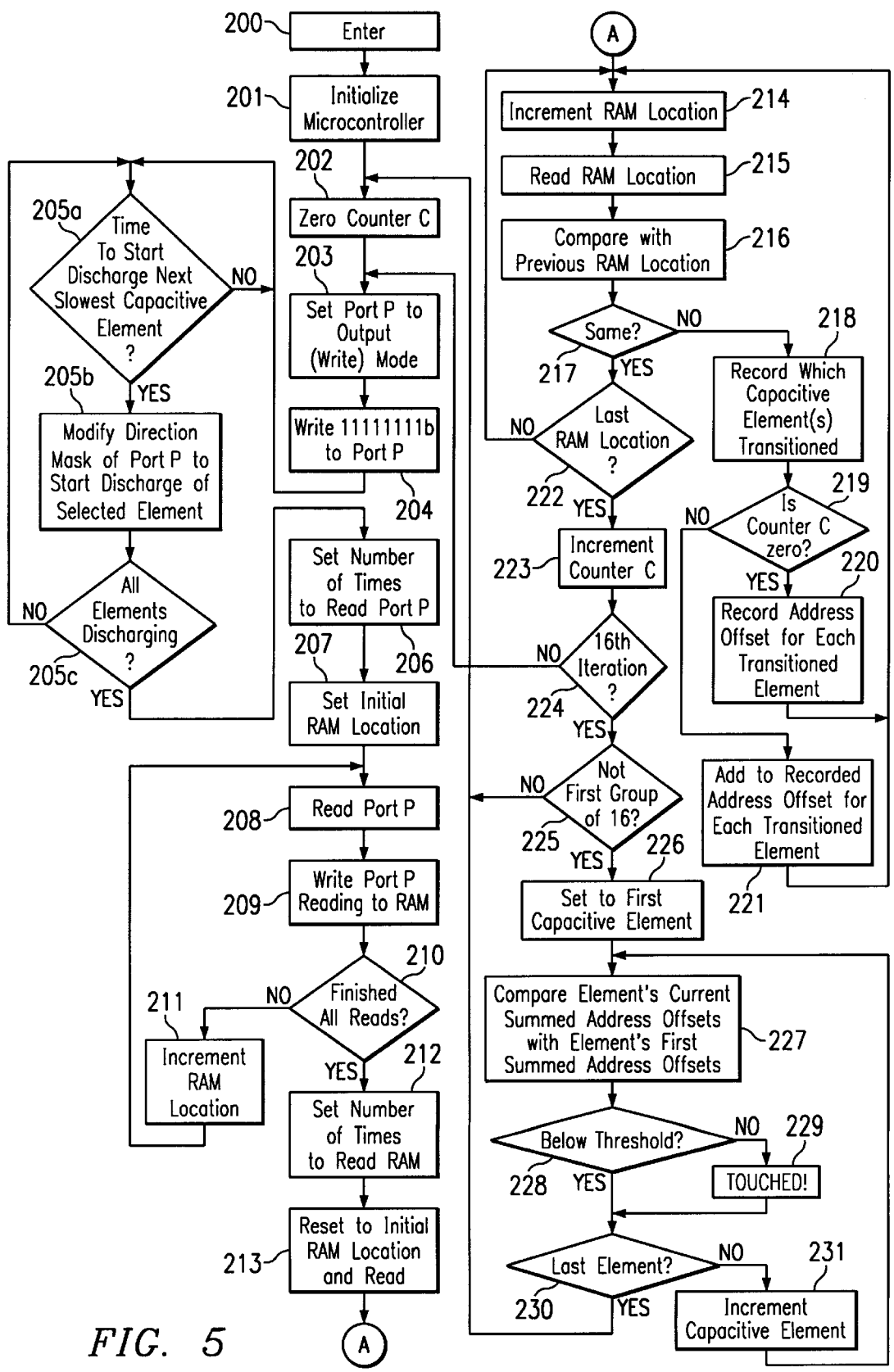
FIG. 5 is a logic flow diagram of a software program executed by microcontroller 12 of FIG. 1 to overcome the effects of noise in detecting a touch.

In operation, noise on any one of capacitance elements $E_1$–$E_8$ reduces the certainty of an accurate detection of a touch condition. Referring to FIG. 5, a logic flow diagram is illustrated for overcoming the effects of such noise in either the microcontroller 12 embodiment of FIG. 1 or the ASIC embodiment of FIG. 4, by summing multiple measurements. For simplicity, the following description refers to the microcontroller 12 only.

Upon sensing a touch, the microcontroller 12 enters the program at logic step 200, and thereafter the logic flow proceeds to logic step 201 to initialize the microcontroller to a known state by clearing all registers and memory locations. From logic step 201, the logic process proceeds to logic step 202 where a counter C of microcontroller 12 is set to a zero count. At logic step 203, the port P is set to an output or write mode in preparation for writing the 8-bit binary value 11111111b to port P at logic step 204.

There is a one-to-one correspondence between each bit of a port P data word and its associated capacitive element. Thus, the write operation sets a logic 1 value on each associated signal line, $S_1$ to $S_8$, to cause each line to charge its associated capacitance element, $E_1$ to $E_8$, to the operating voltage of the circuit.

By the time the logic flow process is ready to execute its next instruction, the touch pads $E_1$–$E_8$ are fully charged. Otherwise, the microcontroller could optionally delay its substantive instructions for a period of time with the use of NOP (no operation) instructions.

In logic steps 205a, 205b, and 205c, the discharge cycle starting iteration for each capacitive element is staggered such that all elements finish discharging on the same iteration, within the limits and resolution of the microcontroller's ROM program. This approach utilizes the microcontroller's I/O port mask which controls, on an individual I/O pin basis, when each pin starts its discharge. In this case, the ROM program sequentially writes a sequence of port masks. The effect of writing these masks is to stagger the discharge starting iterations for each capacitive sensitive element. Writing the correct I/O port mask sequence aligns the capacitive element discharge starting iterations such that all pads discharge below the logic 0 threshold on approximately the same measurement iteration.

The most evident effect from the execution of logic steps 205a, 205b, and 205c is that considerably less RAM memory is required to store the read logic values. That is, the process compensates for the variations in capacitance among the various capacitive elements and therefore fewer reads of the I/O port are required to record all I/O pin transitions.

Referring again to FIG. 5, the logic flow process proceeds from logic step 204 to logic step 205a where it is determined whether it is time to start the discharge cycle of a next slowest I/O pin under consideration. If not, the logic flow iterates until a review of the I/O port masks of microcontroller 12 indicates that it is time to start the discharge cycle. Thereafter, the logic flow process proceeds to logic step 205b to modify the direction mask of the I/O port to start the discharge of the selected capacitive sensitive element or touch pad.

The logic flow process then continues from logic step 205b to logic step 205c to determine whether all capacitive sensitive elements of the selected I/O port have begun discharging. If not, the logic flow process cycles back to logic step 205a to continue as before described. If all of the capacitive elements are found to have commenced to discharge at logic step 205c, however, the logic flow proceeds to logic step 206.

At logic step 206 the number of times to read port P is set, and thereafter the logic flow proceeds to logic step 207 to establish the initial location in RAM 18 to store read values.

At logic step 208, the logic flow process initiates the repetitive process of reading port P, writing the read value to the designated location of RAM 18 at logic step 209, and thereafter determining if all reads have been performed at logic step 210.

If not, the address of the indicated location of RAM 18 is incremented at logic step 211 to the next sequential location of RAM 18 prior to repeating the logic step 208.

As before described, the data rate for performing logic steps 208 and 209 can vary considerably according to the type of read/write logic used and the clock rate of the circuit.

Upon completion of all of the read cycles as indicated at logic step 206, the logic flow process proceeds from logic step 210 to logic step 212 to set the number of RAM 18 locations that must now be processed. Thereafter, the starting location for the processing is set at logic step 213, and the logic flow process continues through node A to logic step 214 where the previous memory location in RAM 18 is incremented.

At logic step 215, the eight bit value which indicates the logic levels of the pins $P_1$–$P_8$, and which is stored in the new location in RAM 18, is read in preparation for a comparison at logic step 216 with the eight bit value stored in the previous RAM 18 location. It should be noted that a change in the current RAM 18 location's eight bit value, relative to the previous location's eight bit value, indicates that at least one capacitive element has changed its logic state. If it is determined at logic step 217 that the two RAM 18 locations contain unequal values, the logic flow process branches to logic step 218 to determine which bit(s) changed from a logic state 1 to a logic 0 state. Since each bit of the word written to port P at logic step 204 corresponds to a capacitive element, a changed bit indicates that the associated capacitive element decayed to a logic 0 prior to the recording of the value stored in the current RAM 18 location. From logic step 218, the logic flow process continues to logic step 219 where the counter C is read to determine whether a count of zero exists, which indicates that a first of sixteen touch readings for each pad is being made. If so, the logic flow continues to logic step 220 where the bit(s) that changed logic state are indicated by recording an offset with respect to the initial RAM 18 location, and associating the offset with a capacitive element. Thus, the offset represents the number of times port P was read before the designated capacitive element transitioned from a logic 1 to a logic 0. If the counter C is not at a zero count at logic step 219, the logic flow process branches to logic step 221 where the offset for each capacitive element that has undergone a logic transition is added to the contents at the recorded RAM address. The logic process thereafter continues from logic step 214 to logic step 217 as before described.

If it is determined at logic step 217 that the current and previous RAM 18 locations contain equal values, no transition occurred during the period between their respective recordings, and the logic flow proceeds to logic step 222 to determine if the last RAM 18 location has been read. If not, the logic flow loops back to logic step 214 to proceed as before described. Once all RAM locations have been processed, the logic flow proceeds from logic step 222 to logic step 223 to increment the counter C by one, and thereafter determine at logic step 224 whether 16 measurement cycles of all of the capacitive elements $E_1$–$E_8$ have occurred. If not, the logic flow process branches to logic step 203 to proceed as before described.

If sixteen measurement cycles of signal lines 51–58 have occurred, and the sixteen sets of measurements have been summed for each capacitive element as indicated by a count of 16 in the counter C, the logic flow process proceeds from logic step 224 to logic step 225 to determine whether the set of sixteen measurements is the first set which has been read. If only a first set of sixteen measurements has occurred, the summed offsets represent the absence of any touch stimuli, and the logic flow returns to logic step 202 to begin another measurement process as before described. Summing consecutive measurements works well in practice and substitutes for an integrator.

If the current set of sixteen signal measurements of port P data is not the first, then the summed offset values represent candidate values (offsets that may have been computed in the presence of a touch stimulus), and the logic flow commences at logic step 226 to determine the presence or absence of touch stimuli in the candidate data. More particularly, the currently summed offset value for each capacitive element is examined beginning with the first capacitive element.

From logic step 226, the logic flow continues to logic step 227, where the latest set of summed offset values of sixteen measurements of a pad are compared to the corresponding nominal offset values of a first sum of sixteen measurements for that pad. The nominal offset values were previously recorded and computed under the assumption that no touch stimuli were present during the measurement process. In the presence of a touch, the candidate offset values will exceed the corresponding nominal offset values, and are likely to yield a difference of 64 or more in the presence of a touch.

After logic step 227, the logic flow continues to logic step 228 to determine whether the difference is greater than a threshold value. If the difference exceeds a predetermined threshold which is set as a result of the previously described empirical data measurements, the logic flow proceeds from logic step 228 to logic step 229 to signal the occurrence of a touching of a touch pad, and thereafter continues to logic step 230. If the difference is less than the threshold value, the logic flow continues from logic step 228 to logic step 230 to determine if all capacitive elements have been examined. If not, the logic flow increments to the next capacitive element at logic step 231, and thereafter returns to logic step 227 to continue as before described. If all of the capacitive elements or touch pads have been processed, the logic flow repeats the entire candidate measurement process by returning from logic step 230 to logic step 202.

Third Embodiment

Referring back to FIG. 4, it will be appreciated that first buffer 182 may be designed to read selected capacitance elements $E_1$ to $E_8$ as they charge, while other ones of capacitance elements $E_1$ to $E_8$ may be read as they discharge. This provides additional benefits depending upon the physical layout of capacitance elements $E_1$ to $E_8$. Consider for example, an interdigitated array of capacitance elements $E_1$ to $E_8$ where capacitive elements $E_1$, $E_3$, $E_5$, and $E_7$ are in interdigitated relation with capacitive elements $E_2$, $E_4$, $E_6$, and $E_8$. Referring to the example illustrated in FIG. 6a, capacitive element $F_1$ is comprised of projecting fingers 250 and 252, while capacitive element $F_2$ is comprised of projecting fingers 251, 253, and 255. When one capacitive element charges while the other capacitive element discharges, a physical touch on the one element shortens the transition time of the other element.

The specific construction of the interdigitated touch pads or capacitive elements is illustrated in more detail in FIG. 6b, where the interdigitated pads are constructed as copper traces on a standard FR4 circuit board following 6 mil space and trace design rules. A highlighted section 256 more clearly shows the traces for capacitive element $F_1$. Capacitive element $F_1$ is comprised of copper trace sections $A_1$, $A_2$, $B_1$, and $B_2$. Capacitive element $F_2$ is comprised of copper trace sections $A_2$, $A_3$, $B_2$, and $B_3$.

In other respects the experimental layout follows the system configuration of FIG. 1, with the exception that capacitive element $F_2$ has its resistor tied to 5 volts rather than to ground. The microcontroller firmware is modified to convert the $F_2$ touch pad from the charge-discharge protocol of FIG. 1 to a discharge-charge protocol.

A switch with interdigitated touch pads can be used to mitigate the effects of noise. That is, if two pads are interdigitated, and the user touches a fraction of both pads simultaneously, the ratio of the signal strengths on the pads will vary according to the ratio of the relative areas touched on each pad. Such a ratio can be scaled and reported as one of a range of discrete values. The following equation (1) is the computation for $$R = \frac{32 \times (F_{1sig} - F_{1nom})}{(F_{1sig} - F_{1nom}) + (F_{2sig} - F_{2nom})} \quad (1)$$

33 discrete values, assuming the maximum signal strengths on each pad are equal. The pads are labeled "$F_1$" and "$F_2$". The subscripts "nom" and "sig" in the above equation respectively denote the recorded pad value in the absence of a touch, and in the presence of a full or partial touch. A minimum value of "0" occurs when a user touches only $F_2$, while a maximum value of 32 occurs when the user touches only $F_1$. Whether all values in between are achievable depends upon the maximum difference between a touched pad's signal strength value and its untouched signal strength value. Noise can affect this computation as illustrated in Table IV. Table IV assumes that all data has been scaled so that the nominal or untouched pad values are "0". The first column represents $F_1$ signal values while the second column represents $F_2$ signal values. Column three is the rounded result "R" of the above equation, applied to the columns 1 and 2. The first row represents the correct measured data while all subsequent rows represent all possible perturbations of ±1 about these correct values. In all cases where the value of the two signals $F_1$ and $F_2$ are changed together in the same direction or only the larger signal value is changed, the resulting value R remained correct (within rounding) in indicating a "Touch" or "No Touch" condition. However, when only the smaller signal value is changed or the signals are changed in opposite directions, the resulting value R was incorrect. This illustrates the importance of having the measured noise affect both signals in the same direction. This is most likely to occur when both signals are measured at the same time.

TABLE IV

| $F_1$ | $F_2$ | R | COMMENTS |
|---|---|---|---|
| 14 | 18 | 14 | |
| 13 | 18 | 13 | (only small signal moved) |
| 13 | 19 | 13 | (signals moved in opposite direction) |
| 13 | 17 | 14 | |
| 15 | 18 | 15 | (only small signal moved) |
| 15 | 19 | 14 | |
| 15 | 17 | 15 | (signals moved in opposite direction) |
| 14 | 17 | 14 | |
| 14 | 19 | 14 | |

Figure 7:
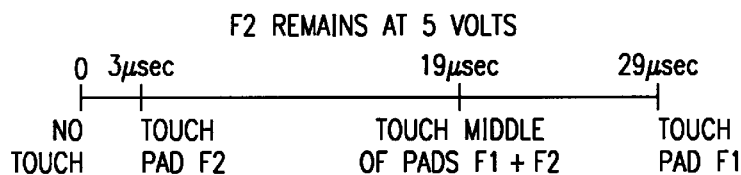
FIG. 7 illustrates a timeline response resulting from holding touch pad F2 at a constant voltage level during the logic level measurements of touch pad $F_1$.
Figure 8:
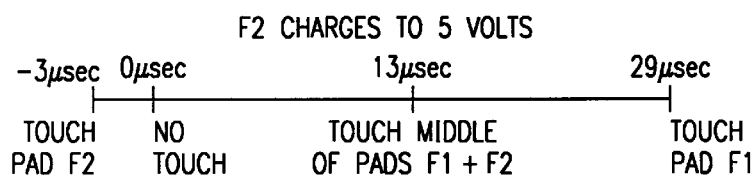
FIG. 8 illustrates a timeline response resulting from charging touch pad $F_2$ while touch pad $F_1$ is discharging.

FIG. 7 and 8 illustrate two timelines featuring relative discharge times for a first interdigitated capacitive element or touch pad $F_1$ during two different circumstances. The two timelines are offset such that the normal discharge times for a "No Touch" condition coincide at 0 μsec. FIG. 7 illustrates the results of holding the second pad $F_2$ at a constant voltage during all measurements. FIG. 8 illustrates the results of charging the second pad, $F_2$, while the first pad, $F_1$, is discharging. Normally, the nominal logic level transitions in the case of FIG. 7 occur earlier in the measurement cycle than in the case illustrated in FIG. 8, hence the use of offsets to align the discharge times for pad $F_1$.

The data depicted in FIGS. 7 and 8 was obtained through the use of the interdigitated touch pads as illustrated in FIG. 6b.

More particularly, FIG. 7 indicates that when pad $F_2$ is held at 5 volts and touched, pad $F_1$ discharges 3 μseconds after it normally would if the pad $F_2$ were not touched. Further, if pad $F_2$ is held at 5 volts, and an area overlapping pads $F_1$ and $F_2$ is touched, pad $F_1$ discharges 19 μseconds after normally would if no pad were touched. Lastly, if pad $F_2$ is held at 5 volts, and pad $F_1$ is touched, pad $F_1$ will discharge 29 μseconds after it normally would in the absence of a touch.

In comparison, FIG. 8 indicates that if pad $F_2$ is being charged from 0 to 5 volts, while pad $F_1$ is discharging, a touching of pad $F_2$ will shorten the nominal discharge time of pad $F_1$ by 3 μseconds. If $F_2$ is being charged from 0 to 5 volts and an area overlapping pads $F_1$ and $F_2$ is touched, pad $F_1$ discharges 13 μseconds after it normally would discharge if no pads are touched. Lastly, if pad $F_2$ is being charged from 0 to 5 volts and pad $F_1$ is touched, pad $F_1$ discharges 29 μseconds after it normally would in the absence of a touch.

In summary, the discharge time for the pad $F_1$ of FIG. 8 is seen to be 3 μsec shorter when the pad $F_2$ is touched than when no pads are touched. In comparison, referring to FIG. 7, where the pad $F_2$ remains at 5 volts for the duration of the measurement, the discharge time of pad $F_1$ increases by 3 μsec when pad $F_2$ is touched.

The decrease in discharge time for pad $F_1$ in FIG. 8 when pad $F_2$ is touched is caused by the pad $F_2$'s increase in capacitance during its charge time. Relative to the untouched case, the "charging" $F_2$ pad generally remains at a lower voltage for a longer time, and therefore initially provides less coupled energy to the discharging $F_1$ pad. Pad $F_1$ thus is allowed to discharge to a predetermined voltage more quickly than in the untouched case.

The increase in discharge time for pad $F_1$ when pad $F_2$ is touched in the FIG. 7 case also is caused by pad $F_2$'s increase in capacitance. Relative to the untouched case, the fully charged $F_2$ pad has a greater capacitance and is able to provide more coupled energy to the discharging $F_1$ pad, thereby causing the $F_1$ pad to discharge more slowly than in the untouched case.

The effects of pad $F_1$ on pad $F_2$ are symmetrical. That is, touching pad $F_1$ while pad $F_2$ is charging also shortens the charge time of pad $F_2$ (to a predetermined voltage) in the case depicted in FIG. 8, and lengthens the charge time of pad $F_2$ in the case depicted in FIG. 7. The advantage of oppositely charged capacitive elements thus is evident since the difference in measured transition times between $F_1$ and $F_2$ is greater, and thus more discernible, than when one pad is held constant.

Algorithmically, detection thresholds generally depend on the relative differences in touched and untouched signal levels on a pad. However, to eliminate false detections, the difference in signal levels among neighboring pads are also considered. In the FIG. 7 case, the difference in signal levels between the $F_1$ and $F_2$ pads is only 26 $\mu$sec (29−3). However, in the FIG. 8 case, the difference is 32 $\mu$sec (29−(−3)). Thus, adopting an oppositely charged pad strategy provides two benefits when a pad is touched: (1) neighboring pads may actually discharge more quickly than otherwise, thereby providing an indicator that a pad has been touched, and (2) the difference in signal levels between the touched pad, and each neighboring but untouched pad validates that a single pad has been touched.

Combining equation (1) with the measurements of FIGS. 7 and 8, and using the assertion of measurement symmetry, Table V below illustrates the result R for full touches on each pad and for touches in the middle between the two pads. These results indicate that a wider dynamic range (38 versus 26) is possible with oppositely charged pads when compared against the same pads where only one is transitioning during a measurement.

TABLE V

|  | R with opposite transitions | R with single transition |
| --- | --- | --- |
| Full touch on $F_1$ | 35 (32 × 29/26) | 29 (32 × 29/32) |
| Full touch on $F_2$ | −3 (32 × (−3)/26) | 3 (32 × 3/32) |
| Touch in between pads | 16 (32 × 13/26) | 16 (32 × 19/38) |

The switch of the present invention exhibits substantial noise tolerance, and hence more accurate operation. Noise signal strength generally changes from measurement to measurement. A first order smoothing algorithm was applied to the summed address offsets described in connection with FIG. 5 to effect a noise cancellation.

Figure 9:
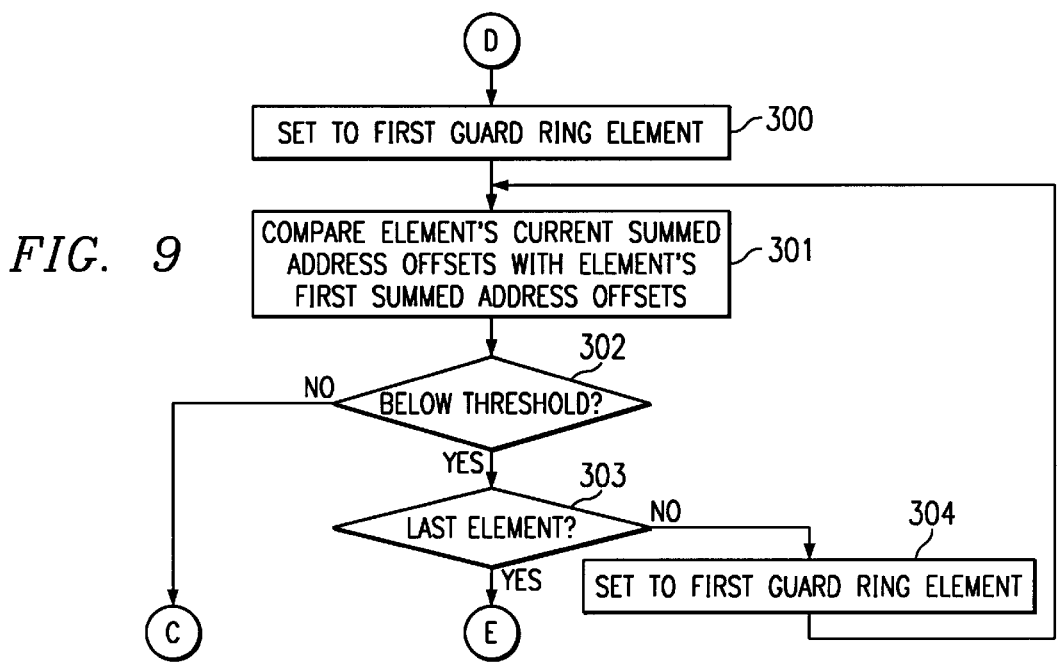
FIG. 9 is a logic flow diagram of the guard ring operation of the microcontroller 12.

Guard ring touch pads are included in the present invention to protect against an inadvertent or unwanted touching generating spurious signals to the microcontroller. A touching of a guard ring inhibits the outputs of the microcontroller until the guard ring touching is removed or a predetermined time period has elapsed. For example, referring to FIG. 9, a logic flow diagram for inhibiting the output commands of the microcontroller is shown. Node C leads to an input of logic step 202 of FIG. 5, node D leads from the "yes" output of logic step 225 of FIG. 5, and node E leads to the input of the logic step 226. Upon a determination at logic step 225 of FIG. 5 that the group of sixteen touch pads which have been measured is not the first group, the logic flow process proceeds to logic step 300 of FIG. 9 to address a first capacitive sensitive touch pad comprising a guard ring. Thereafter, the logic flow process continues to logic step 301 where the current summed address offsets of the guard ring touch pad is compared with the first summed address offsets of the guard ring touch pad. If the current sum exceeds the first sum by at least the threshold amount, the logic flow process branches through node C to logic step 202 of FIG. 5. If the current sum does not exceed the first sum by at least the threshold amount, however, the logic flow process continues to logic step 303 where a determination is made whether all guard ring touch pads have been measured. If not, the logic flow process proceeds to logic step 304 to address a next guard ring touch pad, and then continues to logic step 301 to proceed as before described. If the last of the guard ring touch pads have been considered, the logic flow process proceeds from logic step 303 through node E to logic step 226 of FIG. 5. The effect of the logic flow of FIG. 9 is to disable the outputs of the microcontroller in the event a guard ring touch pad is touched. Additional logic can simply apply a delay to the processing of other capacitive elements while a guard ring touch pad is touched.

It will be appreciated that a switch in accord with the present invention offers significant advantages over known switches. For example, the present switch does not require an oscillator, as is frequently required in a tuned circuit. Instead, the switch uses microcontroller I/O ports to charge capacitance elements $E_1$–$E_8$. Further, the switch does not require either an analog-to-digital converter, or an analog comparator either external to or integral with the microcontroller or ASIC chip, since the switch uses a RAM to record binary digital signals for subsequent processing. Still further, the switch does not need a reference circuit or reference capacitor, since it stores nominal signal values in the RAM. Even further, a switch in accord with the present invention does not require switching circuitry since it uses the microcontroller I/O ports to simultaneously address all capacitive elements. In addition, the switch of the present invention does not utilize a timer as required in many prior art switches to measure charge or discharge times.

Of special significance is the simultaneous measurement of all of the touch pads without the use of expensive switches or duplicate circuitry. Specifically, the current implementation measures up to sixteen capacitance elements simultaneously through the use of low-cost, off-the-shelf microcontrollers such as the Zilog Z86C08. The switch of the present invention further permits the simultaneous measurement of multiple, oppositely charged capacitive elements without the need for additional circuitry. The circuit designer need only decide whether to tie certain capacitive elements through their associated resistors to ground, or to the circuit's operating voltage, and thereafter program the I/O ports accordingly. Even further, the switch of the present invention eliminates much of the analog nature of the measurement process. That is, each measurement cycle consists of a write of a digital signal level followed by multiple reads of a digital signal level.

The present invention also permits component simplification. In one illustrative implementation, the measurement components comprise a single microcontroller with a resistor coupled to each capacitance element. By using resistor packs, the component count may be reduced to a microcontroller and a resistor pack connected to up to a maximum of fifteen (15) capacitance elements. It further will be appreciated that a variety of applications may be facilitated by the programmable feature of the present invention. A user merely programs ROM 16 of FIG. 1 with a new program 20 for each application. Additionally, through the use of a 74HCT245 transceiver, the measurement of the I/O port may also be used for other purposes to allow considerable configuration flexibility.

The invention has been described and shown with reference to particular embodiments, but variations within the spirit and scope of the general inventive concept will be apparent to those skilled in the art. Accordingly, it should be clearly understood that the form of the invention as described and depicted in the specification and drawings is illustrative only, and is not intended to limit the scope of the invention.

Extensions to the described process herein which would be obvious to one skilled in the art include an iterative process for determining the best sequence of port masks to write to an I/O port to stagger the discharge start times of its I/O pins. Many algorithms are possible including a process similar to the nominal adjustment process in which the nominal is increased or decreased by a single iterative count, depending on whether the current reading is greater than or less than the nominal count. Additionally, the use of such staggered discharge start times removes the necessity of maintaining nominal values. This results in additional RAM savings since nominal values currently require 12 bits, and the discharge start times could be stored within a single byte. In the event a transceiver is used as described herein, a sliding window concept for starting and stopping the measurement iteration process can be sued to further reduce RAM usage. For example, the microcontroller 12 may delay the start of recording readings during measurement iterations until just before a first transition in logic levels is expected to occur with a touch pad.

Larger resistor values are also possible since the simultaneous discharge mechanism introduces the same noise into all elements at the end of the measurement cycle. This noise is more accurately canceled when all capacitive elements are subjected to the same noise sources at the end of their discharge cycle, since sudden noise excursions will likely move all untouched, discharging, capacitive elements past their logic 0 threshold, simultaneously.

Shorter discharge time intervals also allow for simpler search algorithms for finding the first transition of a capacitive element to a logic 0. Using a binary search algorithm can create problems if the signal re-crosses the logic 0 threshold since the search is likely to detect either of the crossings, not necessarily the first crossing.

An additional step of varying the start of the discharge times on the pads can be used to compensate for different materials or different thicknesses of materials covering the touch pads. This approach applies primarily to the prior art process of starting the discharge cycle on all pads at the same time. A thicker material generally lengthens the discharge cycle. The algorithm simply delays the start of the measurement process, but not the start of the decay process, one count at a time until it sees each pad's logic 0 threshold crossing.

The benefits of discharging or charging various circuit elements in concert or in opposition can be extended beyond just the touch pads to include the backing "ground plane", the surrounding "ground plane", and the guard rings.

All changes which come within the meaning and range of the equivalence of the following claims are therefore intended to be embraced therein.

What is claimed is:

1. A capacitive sensitive switch, which comprises:
    plural capacitive sensitive touch pads;
    plural resistors each electrically connected to one of said plural capacitive sensitive touch pads and to a preferred voltage state;
    a single programmable microcontroller having an addressable I/O port with plural I/O pins, each of said plural I/O pins being in electrical connection with one of said plural capacitive sensitive touch pads and one of said plural resistors, for setting said plural capacitive sensitive touch pads simultaneously to predetermined voltages, and for transitioning said plural capacitive sensitive touch pads in a staggered manner to compress interation intervals over which said plural capacitive sensitive touch pads undergo logic level transitions, and for measuring logic levels of said plural capacitive sensitive touch pads simultaneously to detect a touch.

2. The capacitive sensitive switch of claim 1, wherein guard ring ones of said plural capacitive sensitive touch pads are arranged with remaining ones of said plural capacitive sensitive touch pads to protect against extraneous touching of said remaining ones.

3. The capacitive sensitive switch of claim 1, wherein a ground plane of said capacitive sensitive switch is removed at least 25 mils from traces electrically connecting said single programmable microcontroller to said capacitive sensitive touch pads to reduce native capacitance of said plural capacitive sensitive touch pads by reducing coupling capacitance of said traces with said ground plane.

4. The capacitive sensitive switch of claim 2, wherein said guard ring ones cause output commands of said single programmable microcontroller to be inhibited until an unwanted touching of said guard ring ones is removed.

5. The capacitive sensitive switch of claim 2, wherein said guard ring ones cause output commands of said single programmable microcontroller to be inhibited until a time period has expired after an unwanted touching of at least one of said guard ring ones has occurred.

6. The capacitive sensitive switch of claim 1, wherein an ASIC chip having a faster logic cycle time than said single programmable microcontroller is substituted for said single programmable microcontroller to allow use of smaller resistors than said plural resistors, and thus reduce overall switch impedance to accommodate faster measurement times.

7. A capacitive sensitive switch, which comprises:
    plural interdigitated capacitive sensitive touch pads, with adjacent ones of said plural interdigitated capacitive sensitive touch pads being oppositely charged;
    plural resistors each electrically connected to one of said plural interdigitated capacitive sensitive touch pads and to a preferred voltage state; and
    a single programmable microcontroller having an addressable I/O port with plural I/O pins, each of said plural I/O pins being in electrical connection with one of said plural interdigitated capacitive sensitive touch pads and one of said plural resistors, for charging adjacent ones of said plural interdigitated capacitive sensitive touch pads simultaneously in an opposite direction for improved resolution in identifying a touching of one of said plural interdigitated capacitive sensitive touch pads, and for discharging said plural interdigitated capacitive sensitive touch pads simultaneously, and for measuring logic levels of said plural interdigitated capacitive sensitive touch pads simultaneously to detect a touch.

8. A capacitive sensitive switch, which comprises:
    plural capacitive sensitive touch pads;
    plural resistors each electrically connected to one of said plural capacitive sensitive touch pads and to a preferred voltage state;
    a RAM memory; and
    a single programmable microcontroller having an addressable I/O port with plural I/O pins, each of said plural I/O pins being in electrical connection with one of said plural capacitive sensitive touch pads and one of said plural resistors, for setting differing logic levels on said plural capacitive sensitive touch pads simultaneously, and for transitioning said plural capacitive sensitive touch pads simultaneously, and for measuring logic levels of said plural capacitive sensitive touch pads simultaneously and recording only logic level transitions and transition iteration numbers to detect a touch, thereby reducing use of said RAM memory.

9. A capacitive sensitive switch, which comprises:

plural capacitive sensitive touch pads;

plural resistors each electrically connected to one of said plural capacitive sensitive touch pads and to a preferred voltage state;

a single programmable microcontroller having an addressable I/O port with plural I/O pins, each of said plural I/O pins being in electrical connection with one of said plural capacitive sensitive touch pads and one of said plural resistors, for setting same logic level on said plural capacitive sensitive touch pads simultaneously, and for transitioning said plural capacitive sensitive touch pads simultaneously, and for measuring logic levels of said plural capacitive sensitive touch pads simultaneously to detect a touch; and a digital I/O transceiver electrically connected to and positioned between said single programmable microcontroller and said plural capacitive sensitive touch pads to accommodate multiple uses of said plural I/O pins, and to shorten trace lengths and thereby reduce charge coupling associated with discharge of said plural capacitive sensitive touch pads.

10. The capacitive sensitive switch of claim 9, wherein said digital I/O transceiver is a 74HCT245 transceiver and acts at the behest of said single programmable microcontroller to cause said plural capacitive sensitive touch pads to be simultaneously set and transitioned, and to accommodate trace lengths between said plural capacitive sensitive touch pads and said 74HCT245 transceiver which are substantially equal.

11. A capacitive sensitive switch, which comprises:

plural groups of capacitive sensitive touch pads having rounded corners;

plural groups of resistors each resistor of said plural groups of resistors being electrically connected to one of said plural groups of capacitive sensitive touch pads, and each resistor of said plural groups of resistors connected to a preferred voltage state;

a single programmable microcontroller having plural addressable I/O ports, each of said plural addressable I/O ports having plural I/O pins in electrical connection with one of said plural groups of resistors and one of said plural groups of capacitive sensitive touch pads, for sequentially addressing each of said plural addressable I/O ports to charge each capacitive sensitive touch pad in an associated one of said plural groups of capacitive sensitive touch pads simultaneously, and for discharging said each capacitive sensitive touch pad in said plural groups of capacitive sensitive touch pads simultaneously to avoid coupling of residual charges among capacitive sensitive touch pads within said plural groups of capacitive sensitive touch pads, while measuring logic levels of all capacitive sensitive touch pads in an associated one of said plural groups of capacitive sensitive touch pads simultaneously to detect a touch.

12. A method of operating a capacitive sensitive switch having a plurality of capacitive sensitive elements, comprising the steps of:

setting individual predetermined logic levels simultaneously on each of said plurality of capacitive sensitive elements which is different from individual preferred logic levels associated with each of said plurality of capacitive sensitive elements;

reading current logic levels of said plurality of capacitive sensitive elements as a logic level set for a predetermined number of iterations, each of said predetermined number of iterations having an associated iteration number;

starting each of said plurality of capacitive sensitive elements to transition to an associated preferred logic level at a same one of said predetermined number of iterations, said same one chosen to permit said plurality of capacitive sensitive elements to transition to their respective preferred logic levels simultaneously in the absence of a touch; and comparing a first associated iteration number at which one of said plurality of capacitive sensitive elements transitions from its preferred logic level with a second associated iteration number for said same one, and issuing a touch or no touch decision for each of said plurality of capacitive sensitive elements depending upon whether a difference between said first associated iteration number and said second associated iteration number exceeds a predetermined threshold number.

13. The method of claim 12 further including the steps of recording said current logic levels with associated iteration numbers for each of said predetermined number of iterations and thereafter analyzing said current logic levels to identify specific iteration numbers associated with iteration cycles during which one or more of said plurality of capacitive sensitive elements underwent a logic transition.

14. The method set forth in claim 13, wherein a binary search algorithm is applied to said current logic levels during the step of analyzing to determine an exact one of said predetermined number of iterations during which at least one of said plurality of capacitive sensitive elements undergoes a logic level transition.

15. The method set forth in claim 12, wherein the step of recording begins at a predetermined one of said predetermined number of iterations following start of the step of reading.

16. The method of claim 13, wherein a linear search algorithm is applied to determine which of said plurality of capacitive sensitive elements undergoes a logic level transition during the step of reading.

17. The method of claim 12, wherein only those of said logic level sets that differ from previous ones of said logic level sets are recorded along with their associated iteration number.

18. The method of claim 12, wherein those of said plural capacitive sensitive elements that have not transitioned after a predetermined iteration are deemed to be touched.

19. A method for determining inputs by touch, the method comprising the steps of:

interfacing a first capacitive sensitive element and a microcontroller with a first trace, the first trace having a first trace capacitance;

interfacing a second capacitive sensitive element and the microcontroller with a second trace, the second trace having a second trace capacitance;

determining whether a touch to the first or the second capacitive sensitive element creates a change of effective capacitance for the first or the second capacitive sensitive element by performing the steps of:

transitioning the capacitive sensitive elements from a first voltage state to a second voltage state, compensating for the change of effective capacitance of the first and second capacitive sensitive elements induced by the first and second trace capacitances, and measuring the voltage of the first and second capacitive sensitive elements at plural iterations to determine whether the effective capacitance of the first or second capacitive sensitive element corresponds to the effective capacitance associated with a touch.

20. The method according to claim 19 wherein the step of compensating for the change of effective capacitance further comprises staggering the transition of the first and second capacitive sensitive elements from the first voltage state to the second voltage state.

21. The method according to claim 20 wherein the step of staggering further comprises staggering the transition of the first and second capacitive sensitive elements to achieve the second voltage state in a substantially simultaneous manner.

22. The method according to claim 19 wherein the step of compensating for the change of effective capacitance further comprises interfacing a transceiver between the microcontroller and a capacitive sensitive element.

23. The method according to claim 22 wherein the transceiver reads the voltage state of the capacitive sensitive element and provides a digital logic output to the microcontroller.

24. The method according to claim 19 wherein voltage indicates a logic level.

25. The method according to claim 19 wherein the step of compensating further comprises separating the first and second traces with a ground plane.

* * * * *